United States Patent
Banerjee et al.

(10) Patent No.: US 9,991,376 B2
(45) Date of Patent: Jun. 5, 2018

(54) HIGH VOLTAGE MOSFET DEVICES AND METHODS OF MAKING THE DEVICES

(71) Applicant: Monolith Semiconductor Inc., Round Rock, TX (US)

(72) Inventors: Sujit Banerjee, Round Rock, TX (US); Kevin Matocha, Round Rock, TX (US); Kiran Chatty, Round Rock, TX (US)

(73) Assignee: Monolith Semiconductor Inc., Round Rock, TX (US)

( * ) Notice: Subject to any disclaimer, the term of this patent is extended or adjusted under 35 U.S.C. 154(b) by 0 days. days.

(21) Appl. No.: 14/966,476

(22) Filed: Dec. 11, 2015

(65) Prior Publication Data

US 2016/0104792 A1    Apr. 14, 2016

Related U.S. Application Data

(63) Continuation-in-part of application No. 14/456,110, filed on Aug. 11, 2014, now Pat. No. 9,214,572.
(Continued)

(51) Int. Cl.
*H01L 29/78* (2006.01)
*H01L 29/08* (2006.01)
(Continued)

(52) U.S. Cl.
CPC ...... *H01L 29/7802* (2013.01); *H01L 29/0696* (2013.01); *H01L 29/0869* (2013.01);
(Continued)

(58) Field of Classification Search
CPC . H01L 21/22; H01L 21/046; H01L 27/14679; H01L 27/098; H01L 29/42356;
(Continued)

(56) References Cited

U.S. PATENT DOCUMENTS

| 4,811,065 A | 3/1989 | Cogan |
| 8,377,756 B1 | 2/2013 | Arthur et al. |

(Continued)

FOREIGN PATENT DOCUMENTS

| EP | 0665595 A1 | 8/1995 |
| EP | 1325522 B1 | 12/2011 |

(Continued)

OTHER PUBLICATIONS

Extended European Search Report dated Sep. 15, 2017 in related European Patent Application No. 14846166.8.

*Primary Examiner* — Natalia Gondarenko
(74) *Attorney, Agent, or Firm* — Maier & Maier, PLLC

(57) ABSTRACT

A SiC MOSFET device having low specific on resistance is described. The device has N+, P-well and JFET regions extended in one direction (Y-direction) and P+ and source contacts extended in an orthogonal direction (X-direction). The polysilicon gate of the device covers the JFET region and is terminated over the P-well region to minimize electric field at the polysilicon gate edge. In use, current flows vertically from the drain contact at the bottom of the structure into the JFET region and then laterally in the X direction through the accumulation region and through the MOSFET channels into the adjacent N+ region. The current flowing out of the channel then flows along the N+ region in the Y-direction and is collected by the source contacts and the final metal. Methods of making the device are also described.

13 Claims, 32 Drawing Sheets

Related U.S. Application Data

(60) Provisional application No. 61/880,214, filed on Sep. 20, 2013.

(51) Int. Cl.
*H01L 29/06* (2006.01)
*H01L 29/10* (2006.01)
*H01L 29/16* (2006.01)
*H01L 29/423* (2006.01)
*H01L 29/66* (2006.01)
*H01L 29/45* (2006.01)

(52) U.S. Cl.
CPC ...... *H01L 29/1095* (2013.01); *H01L 29/1608* (2013.01); *H01L 29/4238* (2013.01); *H01L 29/42356* (2013.01); *H01L 29/66068* (2013.01); *H01L 29/7827* (2013.01); *H01L 29/0878* (2013.01); *H01L 29/456* (2013.01)

(58) Field of Classification Search
CPC ........... H01L 29/4238; H01L 29/66068; H01L 29/1608; H01L 29/66901; H01L 29/66916; H01L 29/66924; H01L 29/0696; H01L 29/8083; H01L 29/8086; H01L 29/66431; H01L 29/66462; H01L 29/0886; H01L 29/47; H01L 29/66333; H01L 29/732; H01L 29/7827; H01L 29/456; H01L 29/0878; H01L 29/1058; H01L 29/1066; H01L 2924/13062; H01L 2924/13091; H01L 29/66893–29/69924; H01L 29/778; H01L 29/7832; H01L 29/0869; H01L 29/1095; H01L 29/0619; H01L 29/7395; H01L 29/6606; H01L 29/8213; H01L 29/0847; H01L 29/7802–29/7815; H01L 29/7845; H01L 21/823418; H01L 21/823814; H01L 29/665; H01L 29/66507; H01L 29/66666; H01L 29/66712–29/66734
USPC .................... 257/77, 362, 341; 438/237, 192
See application file for complete search history.

(56) References Cited

U.S. PATENT DOCUMENTS

| | | | |
|---|---|---|---|
| 2003/0227052 A1* | 12/2003 | Ono | H01L 29/7809 257/341 |
| 2006/0192256 A1* | 8/2006 | Cooper | H01L 29/0696 257/401 |
| 2007/0045727 A1 | 3/2007 | Shiraishi et al. | |
| 2008/0014693 A1 | 1/2008 | Matocha | |
| 2009/0173949 A1 | 7/2009 | Yatsuo et al. | |
| 2010/0193800 A1 | 8/2010 | Uchida et al. | |
| 2010/0320508 A1 | 12/2010 | Ervin et al. | |
| 2011/0101375 A1 | 5/2011 | Zhang | |
| 2011/0254016 A1 | 10/2011 | Ryu | |
| 2012/0007104 A1 | 1/2012 | Wada et al. | |
| 2012/0223339 A1 | 9/2012 | Mizukami | |
| 2012/0261715 A1 | 10/2012 | Kim et al. | |
| 2013/0020586 A1 | 1/2013 | Miura et al. | |
| 2013/0126971 A1 | 5/2013 | Arthur et al. | |
| 2013/0248871 A1* | 9/2013 | Iijima | H01L 29/4983 257/66 |
| 2014/0210008 A1 | 7/2014 | Dritsuki et al. | |

FOREIGN PATENT DOCUMENTS

| | | |
|---|---|---|
| JP | H07-118542 B2 | 12/1995 |
| JP | H07-120798 B2 | 12/1995 |
| JP | 2004006598 A | 1/2004 |
| KR | 10-2010-0105767 A | 9/2010 |
| WO | 2007/035304 A1 | 3/2007 |

\* cited by examiner

HIGH VOLTAGE MOSFET DEVICES AND METHODS OF MAKING THE DEVICES

CROSS-REFERENCE TO RELATED APPLICATIONS

This application is a continuation-in-part of U.S. patent application Ser. No. 14/456,110, filed on Aug. 11, 2014, pending, which claims the benefit of Provisional U.S. Patent Application Ser. No. 61/880,214, filed on Sep. 20, 2013. Each of the above referenced applications is incorporated by reference herein in its entirety.

STATEMENT REGARDING FEDERALLY SPONSORED RESEARCH OR DEVELOPMENT

This invention was made with government support under Grant No. DE AR0000442 awarded by the Department of Energy. The government has certain rights in the invention.

BACKGROUND

Field

This application relates generally to semiconductor devices and methods of making the devices and, in particular, to SiC MOSFET devices having lower specific on-resistance and to methods of making the devices.

Background of the Technology

The properties of silicon carbide are suited for high-voltage power electronic applications. One of the main advantages of silicon carbide over silicon is its higher critical breakdown field strength. Silicon carbide has breakdown field strength of approximately 3 MV/cm compared to 0.3 MV/cm for silicon. The 10× higher breakdown field strength of Silicon Carbide enables semiconductor switches and rectifiers with higher reverse blocking voltages and lower on state resistance enabling superior power electronic system performance than possible with Silicon. Silicon Carbide has a higher thermal conductivity than Silicon enabling better heat dissipation in the high voltage devices and in turn allowing the devices to operate at higher power densities. The low intrinsic carrier density of Silicon Carbide allows higher temperatures of operation of the high voltage devices compared to that possible with Silicon high voltage devices.

There still exists a need, however, for SiC MOSFET devices having improved properties including lower specific on-resistance.

SUMMARY

A semiconductor device comprising at least one semiconductor cell is provided wherein the semiconductor cell comprises:
  a semiconductor substrate layer of a first conductivity type;
  optionally, a buffer layer of a semiconductor material of the first conductivity type on the substrate layer;
  a drift layer of a semiconductor material of the first conductivity type on the buffer layer or on the substrate;
  a first well region of a semiconductor material of a second conductivity type different than the first conductivity type extending in a Y direction in the drift layer;
  a second well region of a semiconductor material of the second conductivity type extending in the Y direction in the drift layer, wherein the second well region is spaced from the first well region in an X direction perpendicular to the Y direction and wherein the ends of the first and second well regions are connected together to form a ring circumscribing a JFET region in the drift layer;
  a first source region of a semiconductor material of the first conductivity type extending in the Y direction in the first well region, wherein the first source region has a depth less than the depth of the first well region such that there is an underlying portion of the first well region beneath the first source region and wherein the first source region is spaced from the JFET region such that a portion of the first well region remains between the JFET region and the first source region;
  a second source region of a semiconductor material of the first conductivity type extending in the Y direction in the second well region, wherein the second source region has a depth less than the depth of the second well region such that there is an underlying portion of the second well region beneath the second source region and wherein the second source region is spaced from the JFET region such that a portion of the second well region remains between the JFET region and the second source region;
  a first heavily doped region of the second conductivity type extending in the X direction between the first and second source regions;
  a second heavily doped region of the second conductivity type extending in the X direction between the first and second source regions and spaced from the first heavily doped region in the Y direction;
  a first source ohmic contact extending in the X direction and contacting the first heavily doped region and the first and second source regions adjacent thereto;
  a second source ohmic contact extending in the X direction and contacting the second heavily doped region and the first and second source regions adjacent thereto, wherein the second source ohmic contact is spaced from the first source ohmic contact in the Y direction;
  a gate dielectric layer on the drift layer and in contact with the first source region and the second source region between the first and second source ohmic contacts;
  a gate electrode on the first gate dielectric layer, wherein the gate electrode is spaced from the first and second source ohmic contacts in the Y-direction;
  an interlayer dielectric on the gate electrode and on a peripheral portion of the first gate dielectric layer not covered by the gate electrode; and
  a source metal region in contact with the source ohmic contacts;
  wherein the gate electrode extends over the first and second source regions in the X direction.

A method of making a semiconductor device is also provided which comprises:
  implanting first and second well regions extending in a Y-direction in a drift layer of a semiconductor material of a first conductivity type, wherein the drift layer is on a substrate, wherein the first and second well regions are of a second conductivity type different than the first conductivity type and wherein the first and second well regions are spaced from one another in an X-direction perpendicular to the Y-direction and are connected together at the ends to form a ring circumscribing a JFET region of semiconductor material of the first conductivity type;
  implanting first and second source regions of the first conductivity type extending in the Y-direction in the first and second well regions, respectively, wherein the first and second source regions are implanted to a depth less than the depth of the first and second well regions such that there is an underlying portion of the first and second well regions beneath the first and second source regions and wherein the first and second source regions are spaced from the JFET region in the X-direction;

implanting a first heavily doped region of the second conductivity type in the drift layer extending in the X-direction between the first and second source regions;

implanting a second heavily doped region of the second conductivity type in the drift layer extending in the X-direction between the first and second source regions and spaced from the first region in the Y-direction;

forming a first source ohmic contact extending in the X direction and contacting the first heavily doped region and the first and second source regions adjacent thereto;

forming a second source ohmic contact extending in the X direction and contacting the second heavily doped region and the first and second source regions adjacent thereto, wherein the second source ohmic contact is spaced from the first source ohmic contact in the Y direction;

forming a gate dielectric layer on the drift layer and in contact with the first source region and the second source region between the first and second source ohmic contacts;

forming a gate electrode on the gate dielectric layer, wherein the gate electrode is spaced from the first and second source ohmic contacts in the Y-direction;

forming an inter-level dielectric layer on the gate electrode and on portions of the gate dielectric layer not covered by the gate electrode; and forming a source metal region on the inter-level dielectric layer and in contact with the source ohmic contacts.

A semiconductor device comprising a plurality of semiconductor cells is also provided, wherein the semiconductor cells include one or more active cells and one or more contact cells;

wherein each of the active cells comprises:

a JFET region of semiconductor material of the first conductivity type in a central portion of the semiconductor cell;

a well region of semiconductor material of a second conductivity type different than the first conductivity type circumscribing the JFET region;

a source region of the first conductivity type formed in the well region and circumscribing the JFET region, wherein the source region is spaced from the JFET region and has a depth less than the depth of the well region such that a portion of the well region remains below the source region;

a gate dielectric layer on the JFET region, well region and source region;

a gate electrode on the gate dielectric layer;

an interlayer dielectric on the gate electrode and on a peripheral portion of the first gate dielectric layer not covered by the gate electrode;

wherein each of the contact cells comprises:

a first layer of semiconductor material of the second conductivity type;

a second heavily doped layer of semiconductor material of the first conductivity type on the first layer;

heavily doped regions of the second conductivity type formed in the first and second layer;

a source ohmic contact in a central portion of the cell and contacting the heavily doped regions and the second layer;

wherein the second layer of each of the contact cells is in electrical communication with the source regions of each of the active cells;

wherein the first layer of each of the contact cells is in electrical communication with the well regions of each of the active cells; and wherein the JFET regions and the well regions of each of the active semiconductor cells and the second layer of the contact cells are on a drift layer of semiconductor material of the first conductivity type which is on a substrate layer of the first conductivity type.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

Figure 1A:
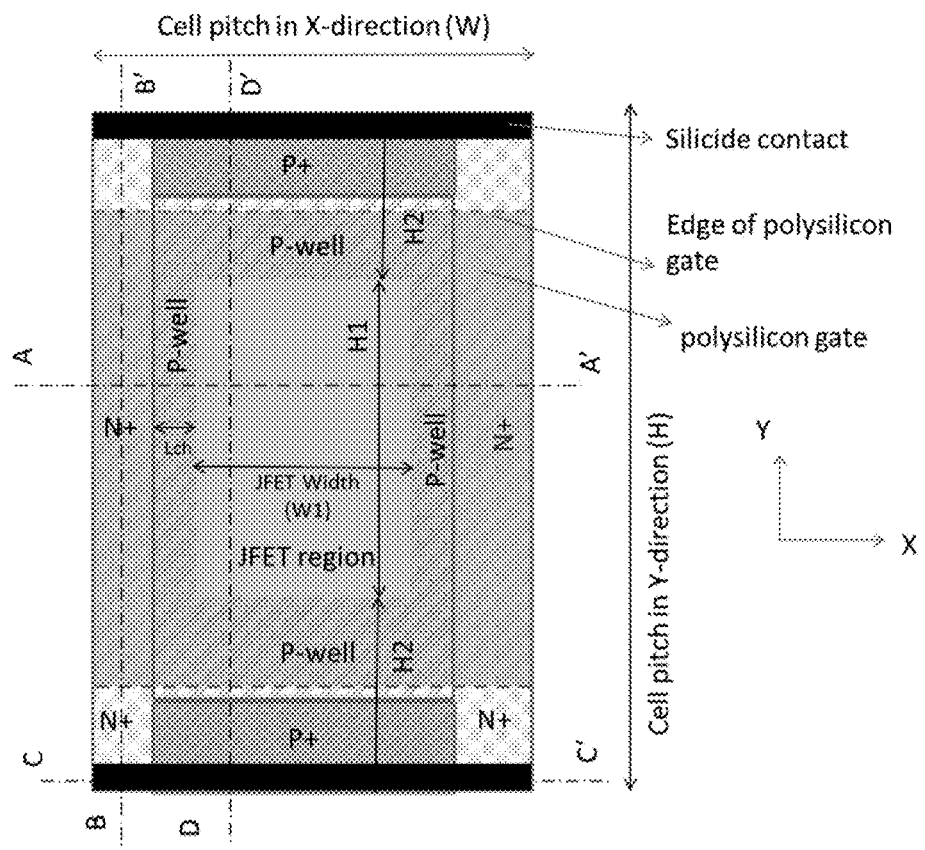
FIG. 1A is a layout view of a unit cell of a MOSFET device according to a first embodiment.

The Double Diffused Metal Oxide Semiconductor Field Effect Transistor (DMOSFET) is a commonly used power semiconductor switch. Since there is very little diffusion of dopants in Silicon Carbide, ion implantation is the predominant method for formation of doped regions in SiC. For this reason, DMOSFETs in SiC stand for Double Ion Implanted MOSFETs.

A "stripe" geometry is commonly used for DMOSFET devices in which the heavily doped P regions, the P-type wells, the n-type source regions and the source contacts are arranged as parallel stripes along the unit cell width or Y direction of the device. During the off-state of the DMOSFET, the drain terminal is biased at high voltage (for example, the drain to source voltage can be at 1200 volts), the gate and source terminals are biased at the ground potential corresponding to 0 volts. The large reverse voltage is supported by the depletion region of the P-N junction diode formed by P-well to N-drift regions. During on-state of the DMOSFET, the application of a gate bias greater than the threshold voltage results in current flow from the drain terminal at the bottom of the structure to the source terminal at the top of the structure.

It is desirable for a DMOSFET switch to have the lowest possible on-state resistance to minimize conduction power loss. The specific on-resistance is a key performance metric for a DMOSFET. Specific on-resistance is a measure of the on-state resistance of the DMOSFET per unit active area and is typically expressed in units of Ohm-cm$^2$. For the same active area (active area is defined as the product of cell pitch or the length of the cell in the X direction and unit cell width in the Y-direction), a DMOSFET with a lower specific on-resistance will achieve a lower on-state resistance (expressed in units of Ohms) compared to a DMOSFET with a higher specific on-resistance.

The on-resistance of the MOSFET is the sum of the resistance of different regions in the MOSFET through which the current passes between the drain terminal at the bottom and source terminal at the top. The current flows vertically from the drain at the bottom of the structure through the drift region into the region between the P-wells (referred to as the JFET region). At the surface of the JFET region (i.e., the interface between the semiconductor and dielectric material), the current flow changes from a vertical direction to a lateral direction. This semiconductor-dielectric interface at the JFET region surface where the current changes direction is sometimes referred to as the accumulation region. From the accumulation region, the current flows laterally through the MOSFET channels on both sides of the JFET region and the adjacent N+ region before it is collected vertically into the adjacent silicide contact and final metal of a conventional device with a stripe geometry. From this description, it is clear that the DMOSFET current flow (typically >95%) at the surface is primarily in the direction of the X-axis, parallel to the length of the MOSFET channels.

The key contributors to the on-state resistance of the DMOSFET are MOSFET channel resistance, JFET region resistance, drift region resistance and the substrate resistance. Each of the above resistance components are minimized for a target reverse blocking voltage (for example a DMOSFET with a reverse blocking voltage target of 1200V). In an optimized SiC DMOSFET, the channel resistance is typically the most significant resistance component due to poor inversion layer mobility. One way to reduce the channel resistance component of the DMOSFET specific on-resistance is by increasing the channel width per unit area; this can be accomplished by reducing the cell pitch of the unit cell.

The cell pitch of a "stripe" geometry DMOSFET unit cell is defined by the JFET region width, channel length, polysilicon gate overlap MOSFET channel spacing, silicide contact to polysilicon gate spacing, width of P+ region and N+ regions. The JFET width and the channel length are device design parameters and are typically minimized while achieving the key electrical performance targets. The minimum dimensions of the other parameters such as polysilicon gate overlap channel spacing, silicide contact to polysilicon gate spacing, width of P+ region and N+ regions are determined by the process technology rules for ensuring manufacturability. These parameters can be considered as "overhead" since they do not contribute directly to the device performance, but make up 40-50% of the cell pitch. These "overhead" parameters results in a larger cell pitch and increase the specific on-resistance of the DMOSFET due to increased active area. There is thus a need for DMOSFET designs that minimize the impact of the "overhead" parameters and enable a further reduction in the specific on-resistance of the DMOSFET by maximizing the channel width for a given active area.

Different layouts and structures are described below that enable a lower specific on-resistance DMOSFET by minimizing the impact of the process technology rules and by maximizing the DMOSFET channel width for a given active area.

As used herein, a layer or region which is "on" an underlying layer or region can be directly on (i.e., in contact with) the underlying layer or region or there can be one or more intervening layers or regions between that layer and the underlying layer or region (i.e., the layer or region can be indirectly on the underlying layer or region).

As used herein, a part of the semiconductor structure (e.g., a layer or region) which is "above" another part of the semiconductor structure is farther from the substrate than the other part of the semiconductor structure.

As used herein, a part of the semiconductor structure (e.g., a layer or region) which is "below" another part of the semiconductor structure is closer to the substrate than the other part of the semiconductor structure.

Figure 1B:
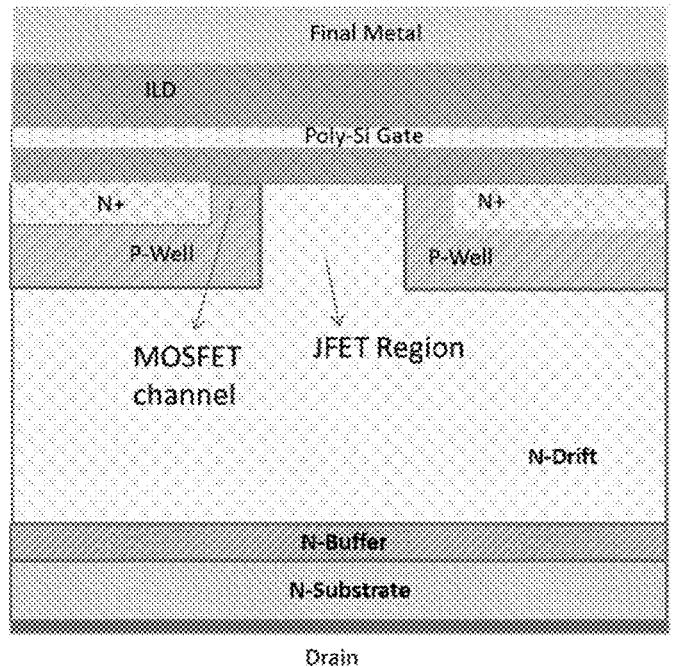
FIG. 1B is a cross-section of the unit cell of FIG. 1A along the cutline A-A'.

FIG. 1A shows the layout view of a first embodiment of a MOSFET device. To explain the differences and demonstrate the benefits of the proposed DMOSFET structure compared to a DMOSFET structure having a stripe geometry, device cross-sections along different cutlines (such as A-A', B-B' etc.) are shown in subsequent figures. FIG. 1B shows the DMOSFET cross-section of the proposed structure along the cutline A-A'. As shown in FIG. 1B, the DMOSFET current flows vertically from the drain contact at the bottom of the structure into the JFET region and then the current flows laterally in the X direction through the accumulation region and through the MOSFET channels into the adjacent N+ region. Unlike the DMOSFET having a stripe geometry, the current is not vertically collected by the silicide contact at this point.

Figure 1C:
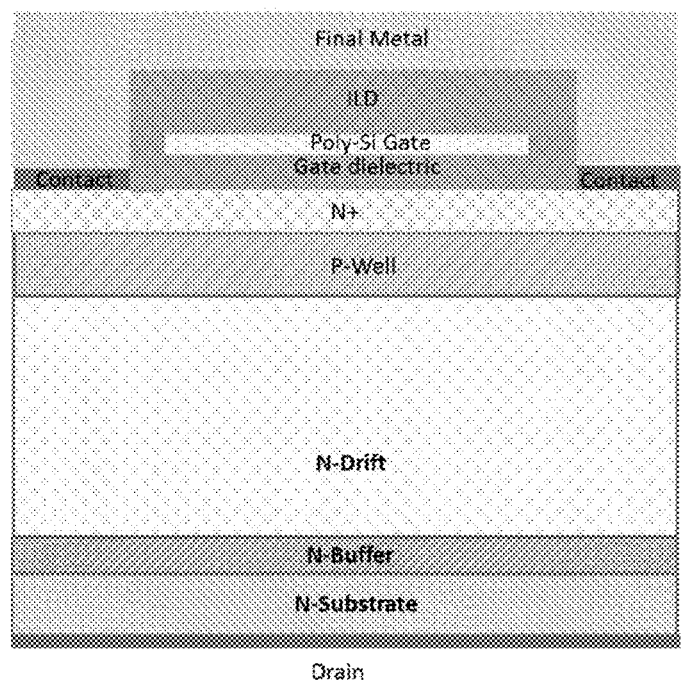
FIG. 1C is a cross-section of the unit cell of FIG. 1A along the cutline B-B'.

The current flowing out of the MOSFET channel changes direction laterally and flows in the N+ region in the Y-direction (refer to X-Y axis in FIG. 1A) along cutline B-B' in FIG. 1B. As shown in the device cross-section along cutline B-B' (FIG. 1C), the current is eventually collected by silicide contact and the final metal. The distance between the polysilicon gate and the silicide contact is defined by process design rules. With this layout approach, the silicide contact in the cell is eliminated in the X-direction and this allows for a continuous polysilicon gate over the unit cell. This in turn eliminates the need for polysilicon gate to silicide contact spacing and gate overlap of N+ spacing design rules almost eliminating the entire "overhead" that is present in the prior art DMOS structure and allows for shrinking of the cell pitch in the X-direction by 40-50%. A shrink in the cell pitch reduces the active area and lowers the specific on-resistance of the DMOSFET.

Resistance of the N+ region through which the current flows (along cutline B-B') before reaching the silicide contact adds some resistance to the total DMOSFET resistance. However, this resistance is small compared to the reduction in channel resistance component that is enabled. The extra N+ resistance and the extra P-well resistance, a result of the elimination of the P+ region in the main device cross-section, are important design considerations for designing the cell pitch in the Y-direction for improved robustness of the device to voltage transients.

Figure 1D:
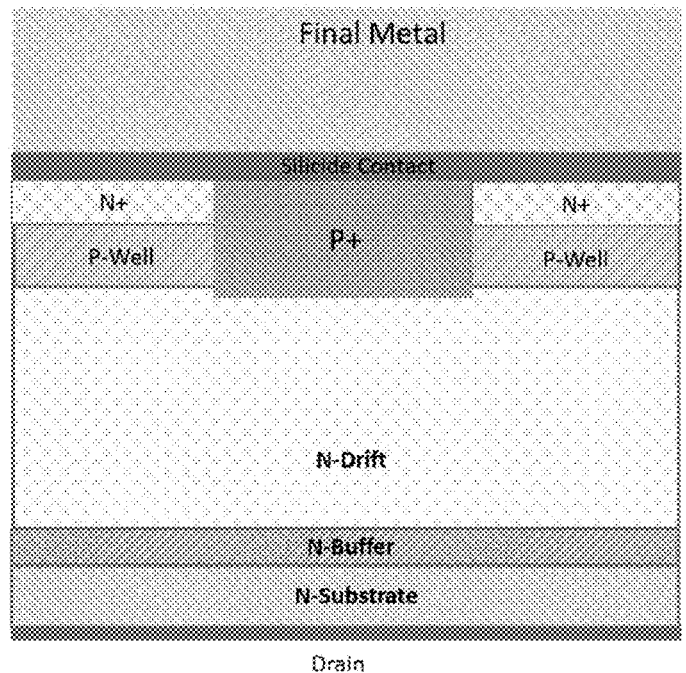
FIG. 1D is a cross-section of the unit cell of FIG. 1A along the cutline C-C'.

Cross-section through C-C' line at end region of the cell is shown in FIG. 1D. This cross-section contains the silicide contact to the N+ and P+ regions that collect the current from N+ and P+ regions, but it does not have any active MOSFET channel. The end region can be considered as "overhead" for this proposed DMOSFET layout.

Figure 1E:
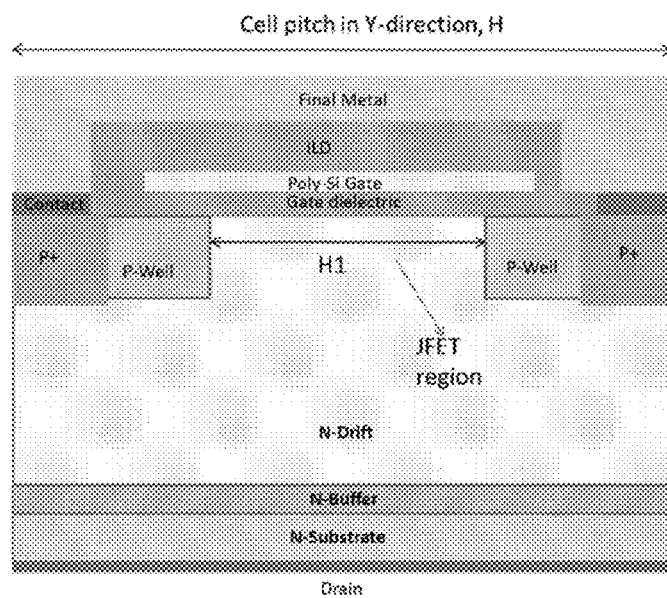
FIG. 1E is a cross-section of the unit cell of FIG. 1A along the cutline D-D'.

As can be seen from FIG. 1A, the N+, P-well and JFET regions extend in one direction (the Y-direction) and the by P+ and source contacts extend in an orthogonal direction (X-direction) at spacing defined by the cell pitch in Y-direction. A cross-section of the device through the D-D' cutline is shown in FIG. 1E. As shown in FIG. 1E, the polysilicon gate runs over the JFET region and is terminated on the P-well region to minimize electric field at the polysilicon gate edge. The distance between silicide contact and gate edge is defined by process design rules. The height of the end-region (H2) is primarily defined by the process design rules. The cell-pitch in the Y-direction (H) is determined by the height (H1) of the active region which contains the MOSFET channel and the height (H2) of the end-regions.

In a typical 1200V DMOSFET design, the JFET width (W1) can be 1 μm to 6 μm, cell pitch in X-direction (W) can be 2 μm to 10 μm, active height (H1) can be 2 μm to 20 μm, end-region height (H2) can be 1 μm to 4 μm and cell pitch in Y-direction (H) can be 4 μm to 30 μm. For a higher or lower voltage design, these numbers will be optimized accordingly.

The proposed structure as described in FIGS. 1A-1E enables a 2× increase in channel width per active area compared to the prior art DMOSFET. This in turn enables a reduction in the channel component of the specific on-resistance and the overall DMOSFET specific on-resistance compared to a DMOSFET having a stripe geometry.

Figure 2A:
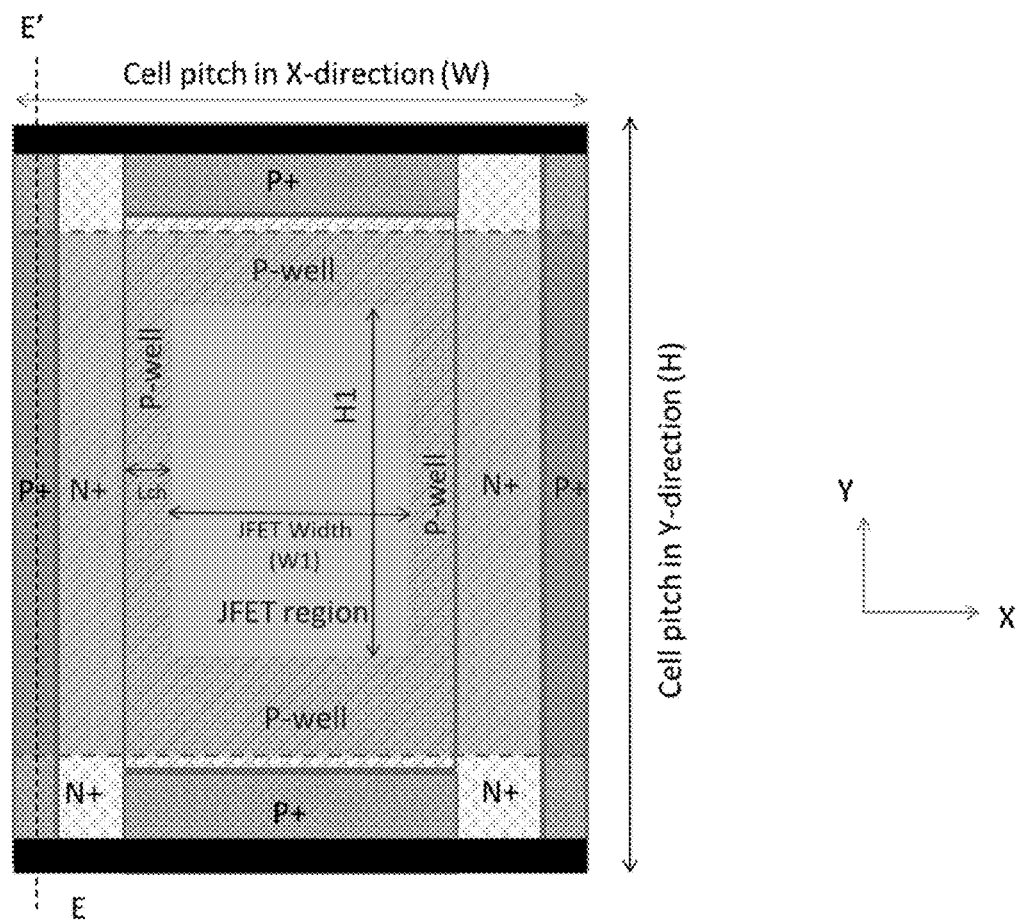
FIG. 2A is a layout view of a unit cell of a MOSFET device according to a second embodiment.
Figure 2B:
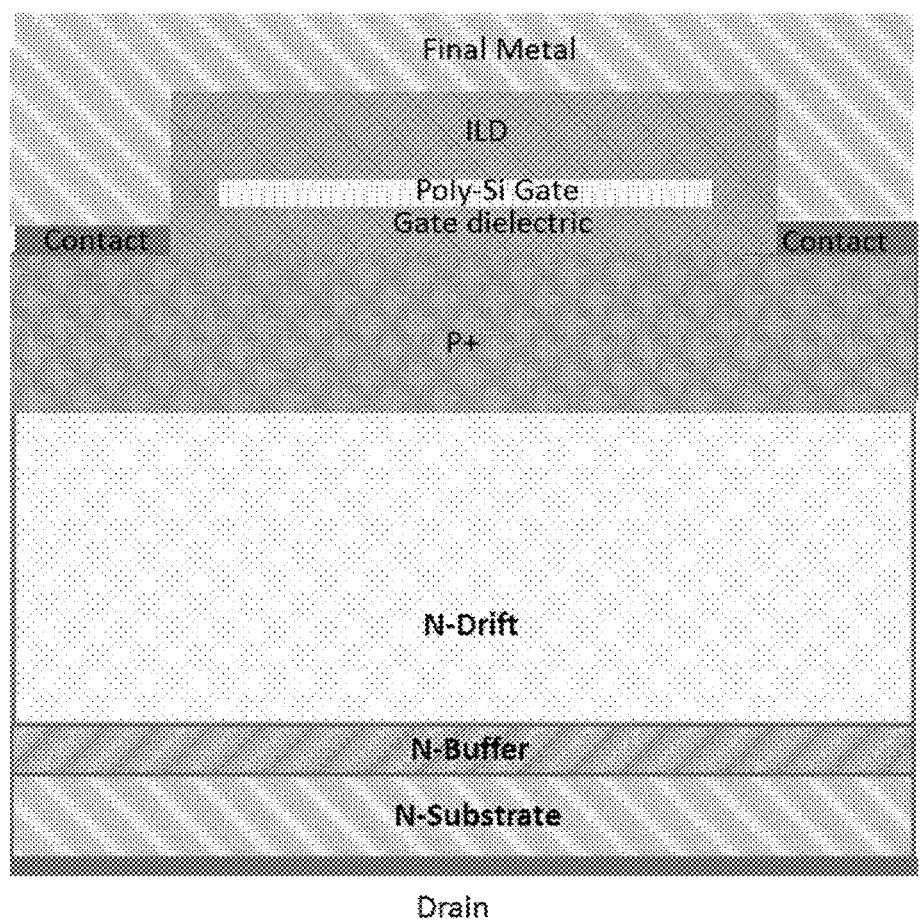
FIG. 2B is a cross-section of the unit cell of FIG. 2A along the cutline E-E'.

A second embodiment of a MOSFET device is depicted in FIG. 2A. As shown in FIG. 2A, a P+ stripe is added extending in the Y-direction along cutline E-E' next to the N+ regions. This P+ region is included to minimize the P-well resistance. While this addition will increase the cell pitch in X-direction (W), this design will allow a longer height (H1) of the active section to be used in the Y-direction resulting in an increase in channel width per active area. FIG. 2B is a cross-section of the device through the E-E' cutline.

Figure 3A:
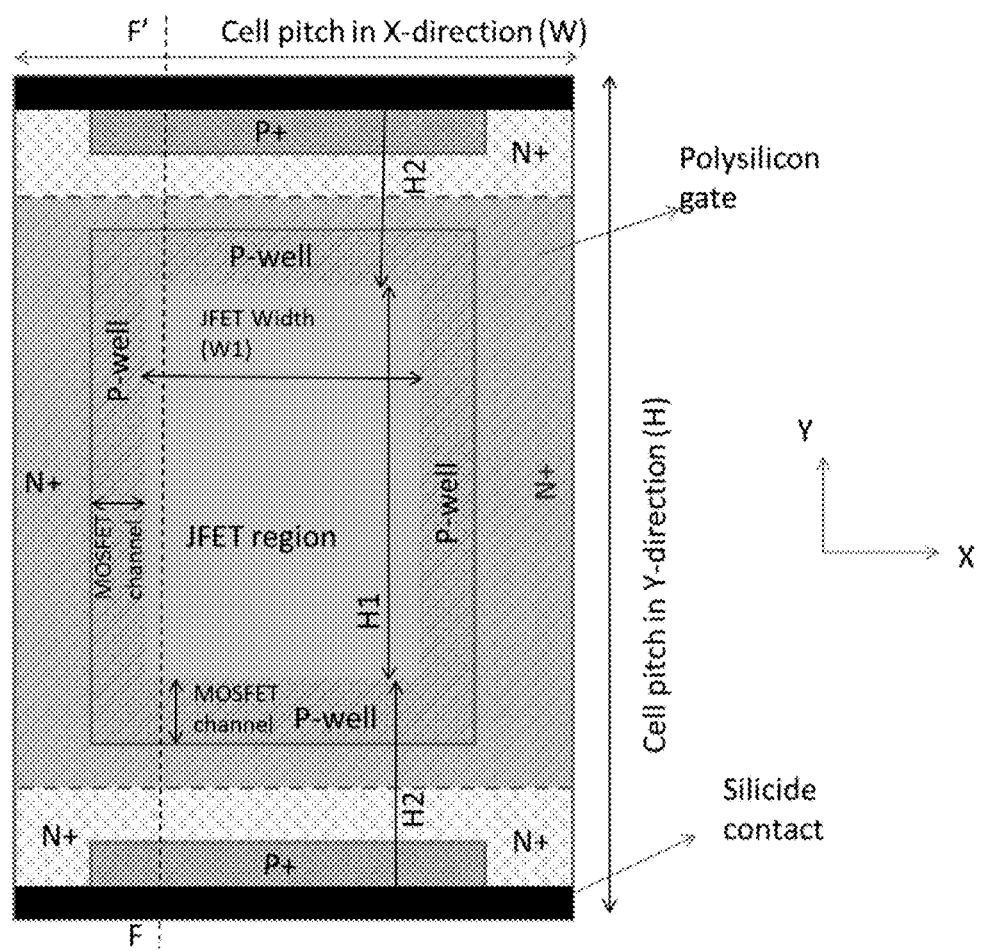
FIG. 3A is a layout view of a unit cell of a MOSFET device according to a third embodiment.
Figure 3B:
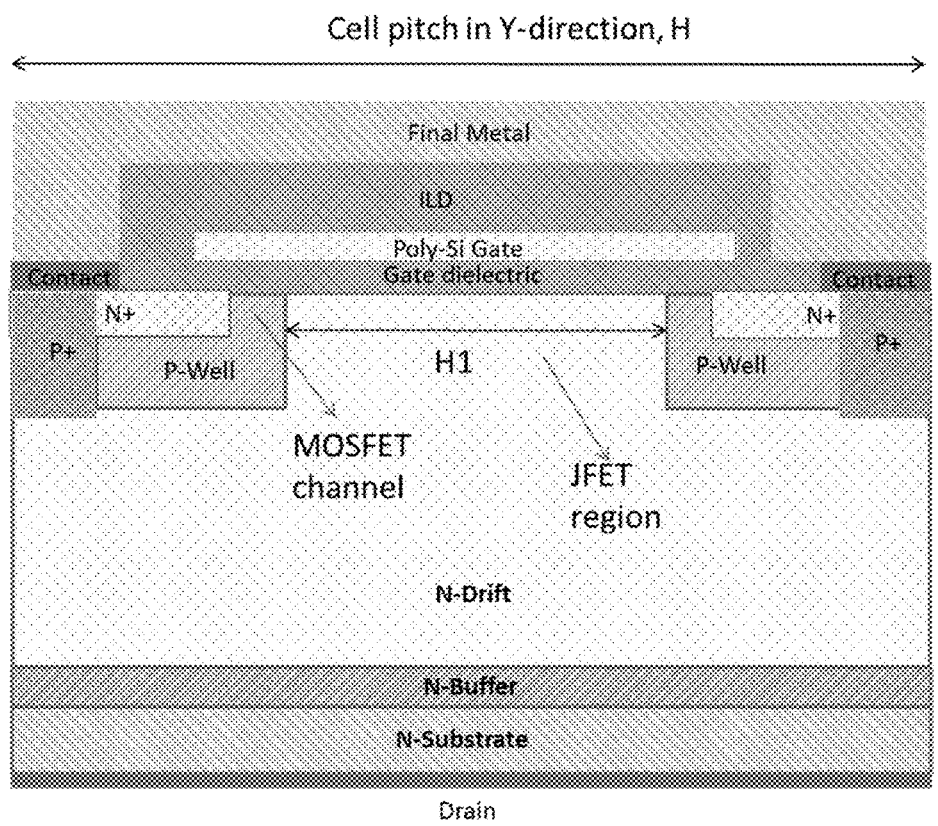
FIG. 3B is a cross-section of the unit cell of FIG. 3A along the cutline F-F'.

A third embodiment of a MOSFET device is depicted in FIG. 3A. As shown in FIG. 3A, additional MOSFET channels in the Y-direction are enabled by the addition of N+ regions extending in the X-direction at the top and bottom of the structure. The presence of the additional MOSFET channels in this embodiment is illustrated by comparing the cutline F-F' in FIG. 3B with the cutline D-D' of the embodiment depicted in FIG. 1A. The additional MOSFET channel increases the height (H2) of the end-region and increases the cell pitch in Y-direction (H), but there is also an increase in channel width per active area.

Figure 4A:
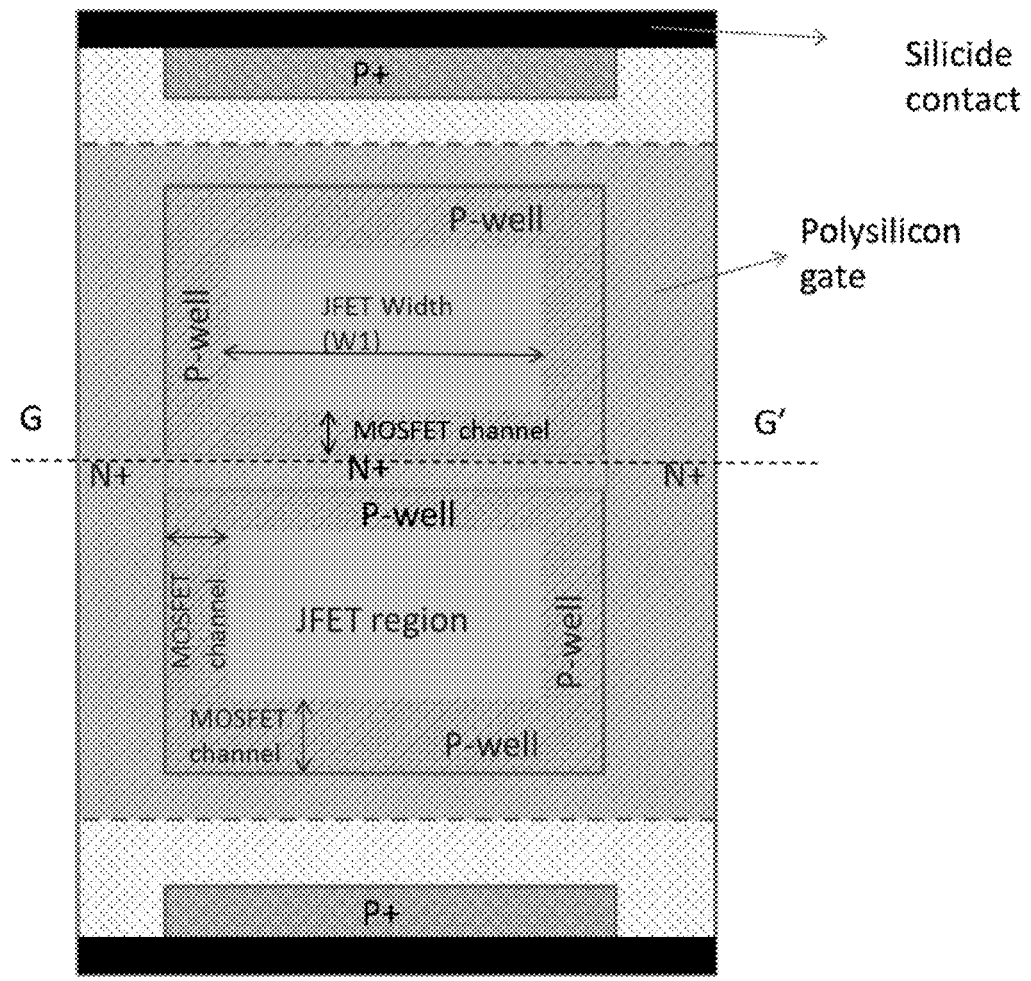
FIG. 4A is a layout view of a unit cell of a MOSFET device according to a fourth embodiment.
Figure 4B:
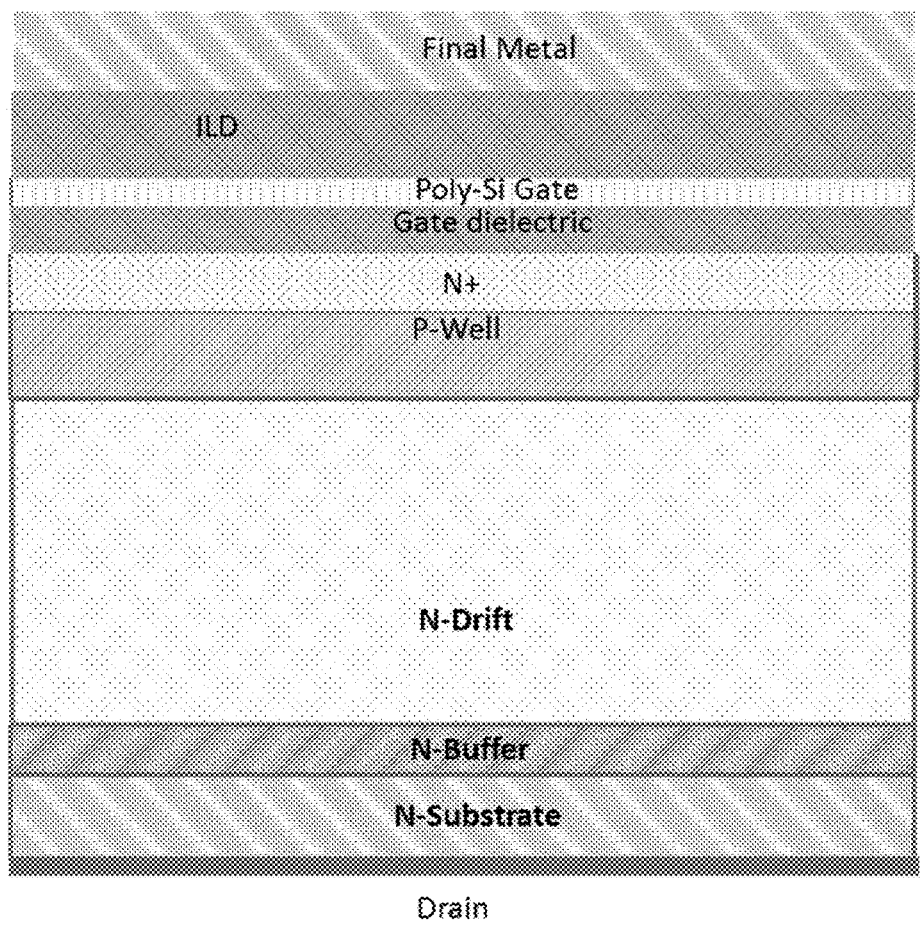
FIG. 4B is a cross-section of the unit cell of FIG. 4A along the cutline G-G'.

A fourth embodiment of a MOSFET device is depicted in FIG. 4A. As shown in FIG. 4A, active MOSFET channel regions are added in the middle of the cell by adding a P-well stripe and an N+ stripe. The additional MOSFET channels will increase the channel width. As shown in FIG. 4A, there are no silicide contacts in the middle region of the cell. In the device depicted in FIG. 4A, the current will travel along the N+ stripe (refer to as cutline G-G' in FIG. 4A) in the X-direction and then the current will change directions to flow along the Y-direction to be collected by the silicide contacts and final metal. FIG. 4B is a cross-section of the device through the G-G' cutline.

Figure 5:
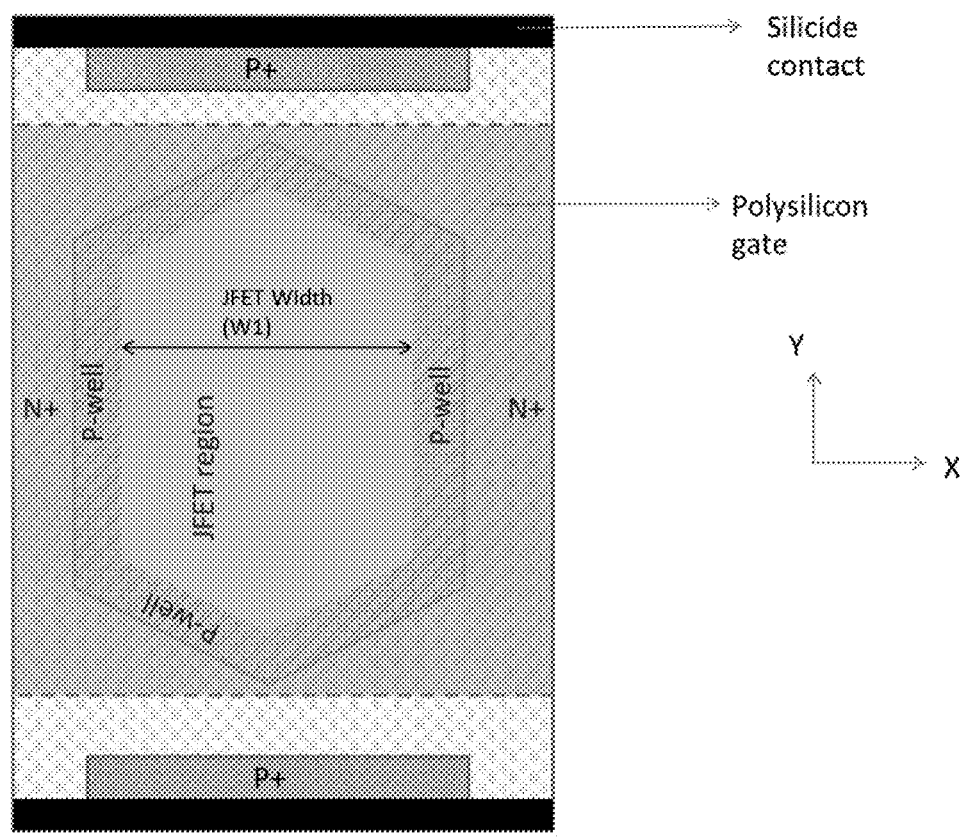
FIG. 5 is a layout view of a unit cell of a MOSFET device according to a fifth embodiment.

A fifth embodiment of a MOSFET device is depicted in FIG. 5. As shown in FIG. 5, the active region in the Y-direction can be laid out in two sections. The first section can be a straight line and second section connecting the straight section to the inactive section can be at an angle. The length of the straight section and the angle are the design parameters. This layout can be used to reduce the P-well and N+ region resistance between the channel and the silicide contacts.

Figure 6:
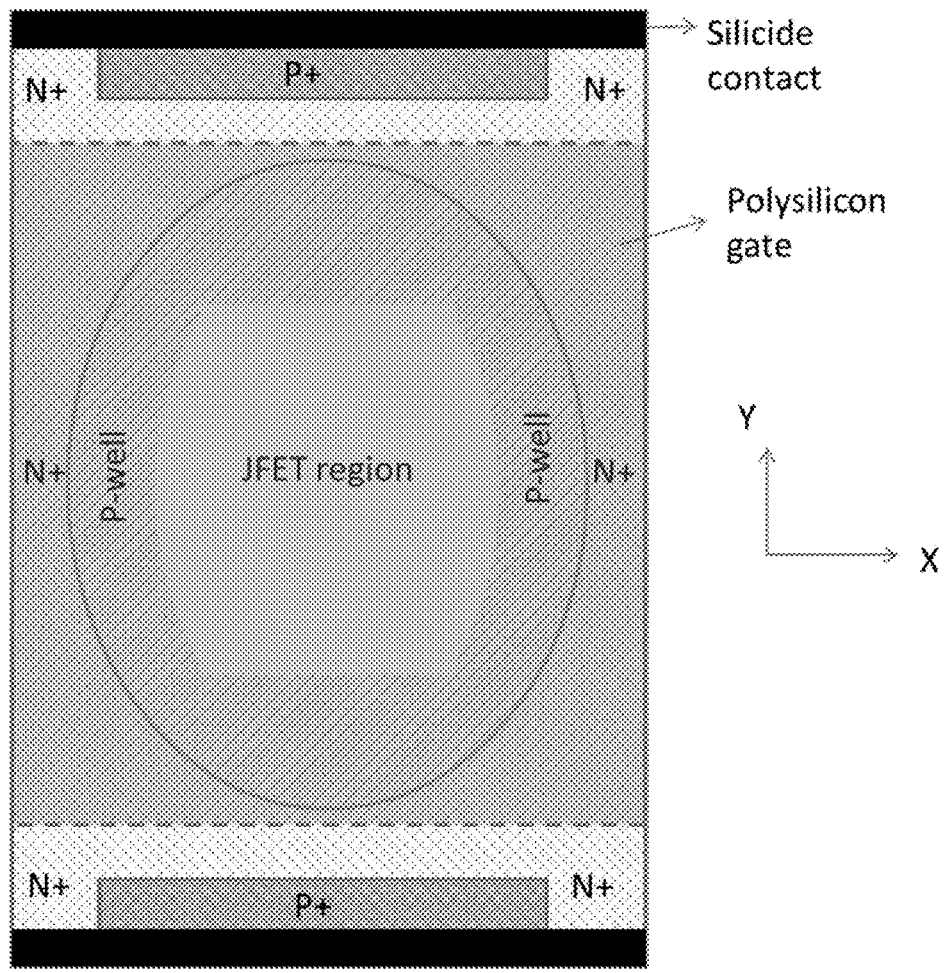
FIG. 6 is a layout view of a unit cell of a MOSFET device according to a sixth embodiment.

A sixth embodiment of a MOSFET device is depicted in FIG. 6. As shown in FIG. 6, the angled section may be converted to a curve of any shape to further minimize the P-well and N+ region resistance between the channel and the silicide contacts. As shown in FIG. 6, the curved shape is in the form of an ellipse.

Figure 7:
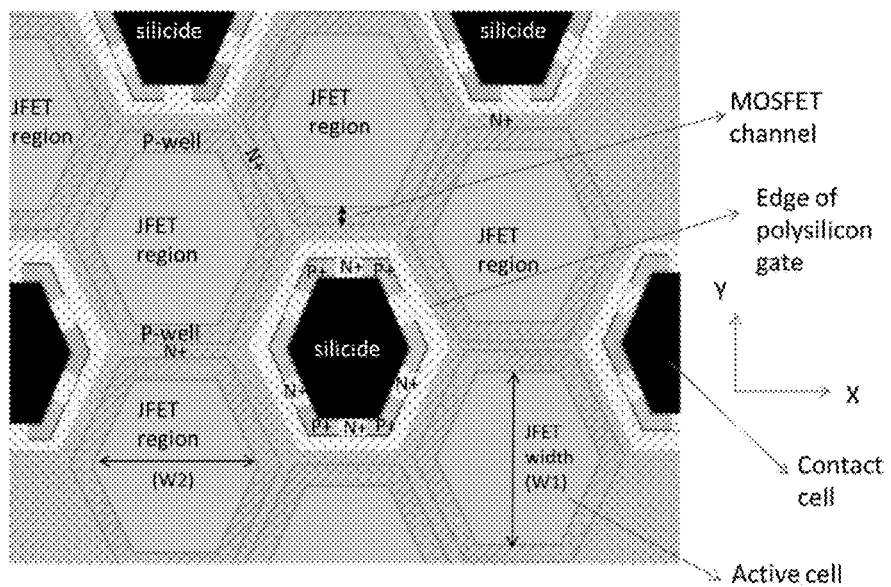
FIG. 7 is a layout view of a MOSFET device according to a seventh embodiment.

A seventh embodiment of a MOSFET device is depicted in FIG. 7. As shown in FIG. 7, this concept can be further extended to create a hexagonal cell structure. In this case, the channel and N+ regions are laid out in hexagonal cells and interconnected. As shown in FIG. 7, there are two types of hexagonal cells-active cell and the contact cell. The active cell contains the JFET region, the active MOSFET channel and N+ regions. The contact cell contains the silicide contact to N+ and P+ regions. Current flows vertically through the JFET region in the active hexagonal cells and then laterally through the MOSFET channel and then through the interconnected N+ regions until it reaches a cell containing the silicide contacts. Current is collected by silicide contact to N+/P+ and transferred to the source final metal. This layout can be used to increase the channel width per active area, also referred to as the channel density by more than 3× compared to the prior art layout. As shown in FIG. 7, each hexagonal contact cell is surrounded by 6 hexagonal active cell.

Figure 8:
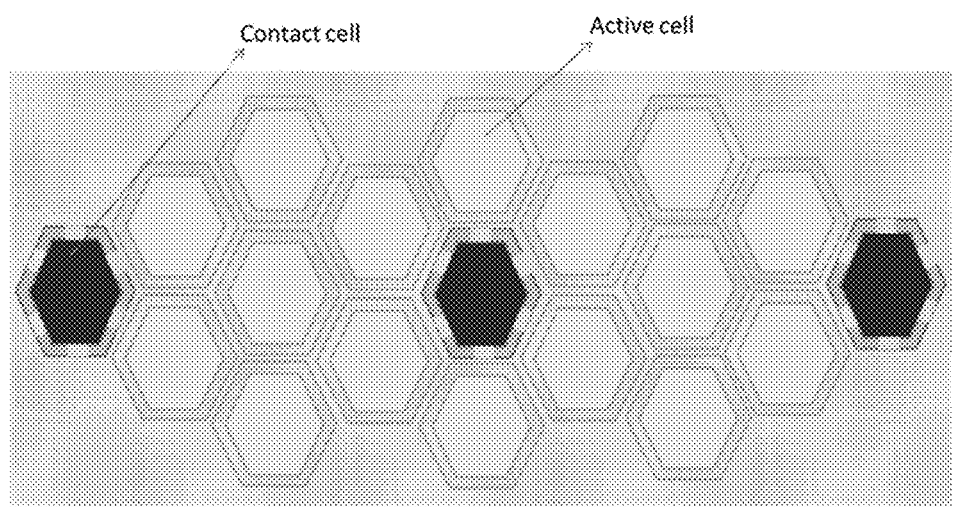
FIG. 8 is a layout view of a MOSFET device according to an eighth embodiment.

An eighth embodiment of a MOSFET device is depicted in FIG. 8. As shown in FIG. 8, the ratio of the number of hexagonal active cells to the number of contact cells is larger than in the device depicted in FIG. 7. The presence of fewer contact cells increases the channel width per active area. The layout can be optimized based on the need to maximize channel density vs. the need to minimize N+ and P-well resistance.

FIGS. 9A-9E are schematics illustrating a method of making a MOSFET device as shown in FIG. 1A. The cross-sections depicted are along the cutline A-A' of FIG. 1A.

Figure 9A:
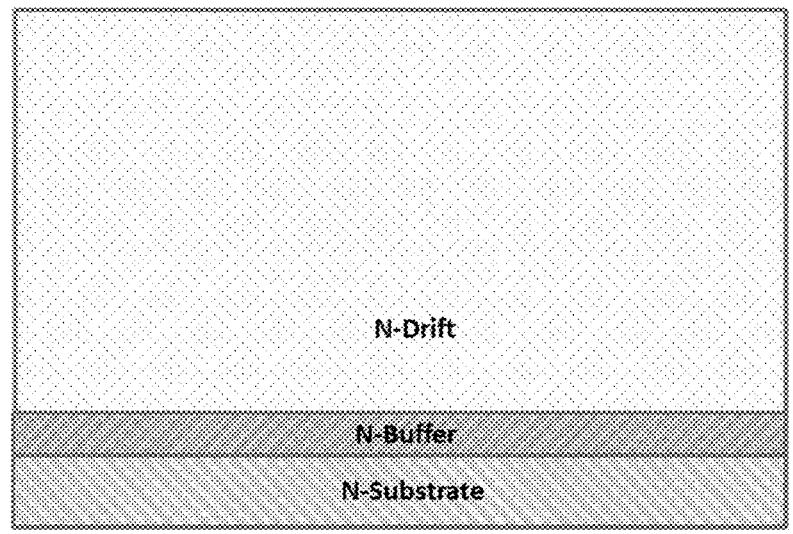
FIGS. 9A-9E are schematics illustrating a method of making a MOSFET device.

FIG. 9A shows a starting epilayer stack. As shown in FIG. 9A, the starting epilayer stack comprises an N-type substrate, an N-type buffer layer on the substrate and a N-type drift layer on the buffer layer. Although the device depicted in FIG. 9A includes an N-type buffer layer, the N-type buffer layer is optional and the N-type drift layer can be formed directly in contact with the N-type substrate.

Figure 9B:
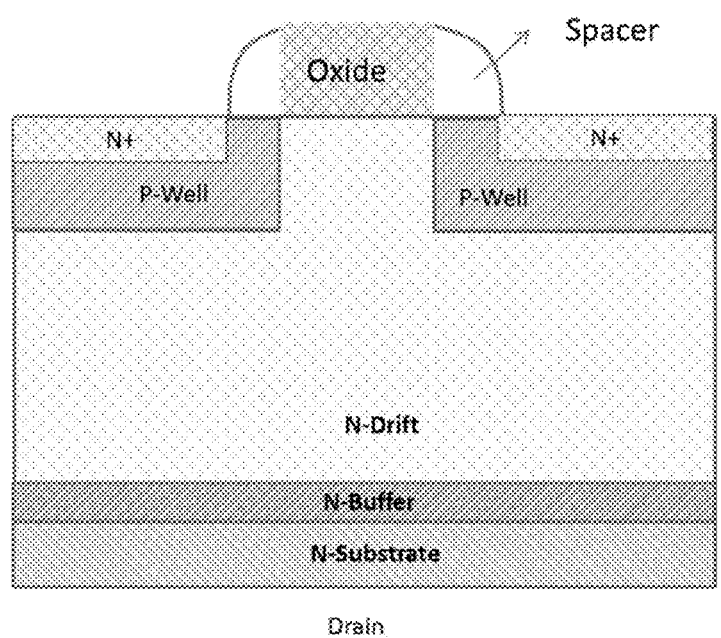

FIG. 9B illustrates the formation of the P-type well and the N+-type source regions. As shown in FIG. 9B, the p-type well regions can be formed by deposition of an implant masking material (oxide shown), patterning the implant masking material (e.g., using an oxide etch) followed by implanting the p-type wells. As also shown in FIG. 9B, a spacer (e.g., oxide) can then be deposited adjacent the patterned P-type well implant masking material. The spacer can then be etched and formed and the N+-type source regions can then be implanted in the p-type well regions.

Figure 9C:
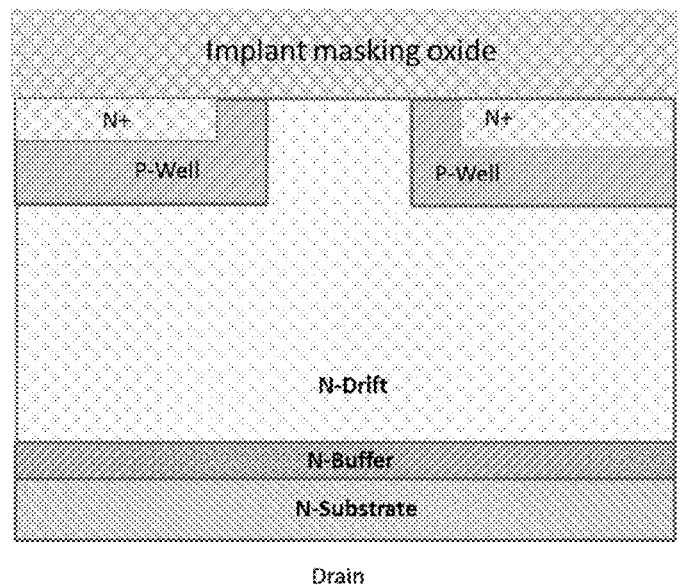

FIG. 9C illustrates the formation of the heavily doped regions or P+-type regions at the ends of the device. As shown in FIG. 9C, the P+ regions can be formed by depositing a P+-type implant masking material (oxide shown), patterning the masking material (e.g., etching the oxide masking material) and implanting the P-type dopants through openings in the mask. As shown in FIG. 9C, the P+-type implant is blocked along the A-A' cutline. After deposition of the P+-type implants, the implants can be annealed.

Figure 9D:
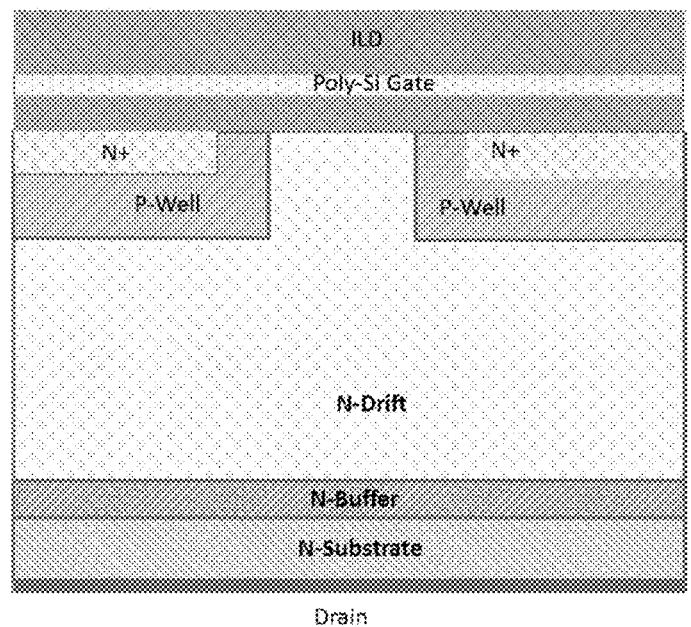

FIG. 9D illustrates the formation of the inter-level dielectric (ILD) and polysilicon gate regions of the device. First, the gate can be formed by oxidation followed by polysilicon deposition and patterning a masking material on the polysilicon. Polysilicon can then be selectively removed by etching. The polysilicon is not etched along the A-A' cutline so selective removal is not illustrated in FIG. 9D. The inter-level dielectric is then deposited on the polysilicon gate. Source contacts can then be formed by patterning a masking material and forming the contacts. The backside or drain contact can then be formed. A metal liftoff procedure can be used for contact formation. The contacts can then be annealed. Gate contacts can also be formed at this stage of the process.

Figure 9E:
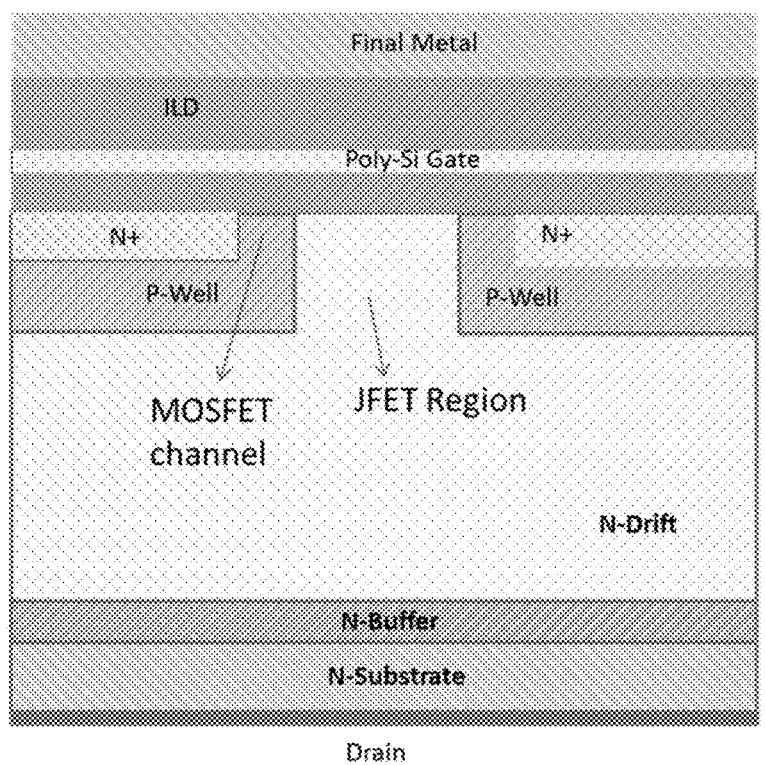

FIG. 9E illustrates final metal deposition and final metal patterning and etching. As shown in FIG. 9E, final metal is deposited on the inter-level dielectric and in contact with the source contacts at the ends of the device (not shown in FIG. 9E).

According to some embodiments, a device comprising an integrated Schottky diode is provided. When added to a power MOSFET, the integrated Schottky diode can reduce the reverse conduction losses and reduce the switching losses of the device. Also, the Schottky diode can prevent turn-on of the MOSFET body-diode thereby ensuring long-term stability of the MOSFET conduction properties and leakage currents. In SiC MOSFETs, the presence of an integrated Schottky contact can also prevent the formation and expansion of basal plane dislocations that have been linked to degraded device performance, including on-resistance and leakage current.

The integrated Schottky serves as an antiparallel rectifier to provide low voltage drop during reverse conduction of the semiconductor device. Also, by providing an integrated Schottky contact in the MOSFET cell, the requirement for an externally connected Schottky rectifier is eliminated, thus reducing complexity and cost, and eliminating parasitic effects due to interconnect inductances.

Figure 10A:
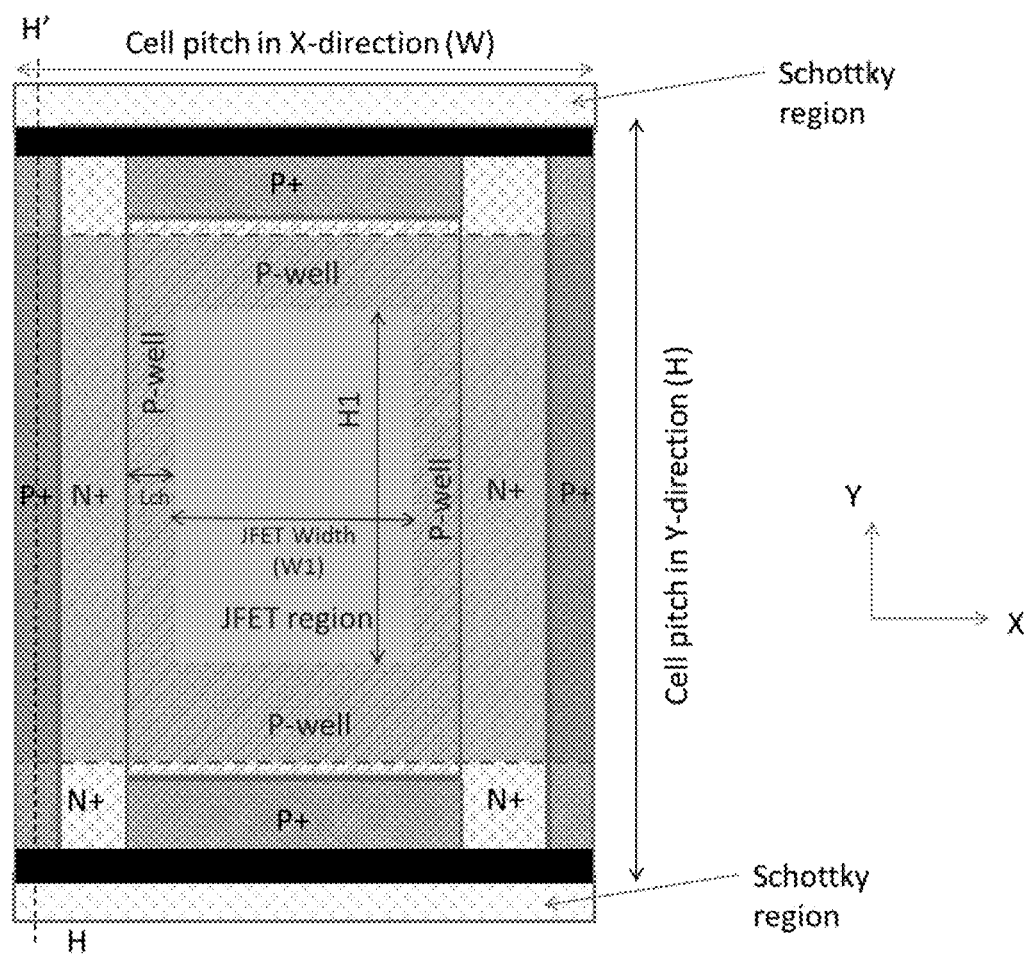
FIGS. 10A and 10B are schematics of a single cell of a MOSFET device having an integrated Schottky diode.
Figure 10B:
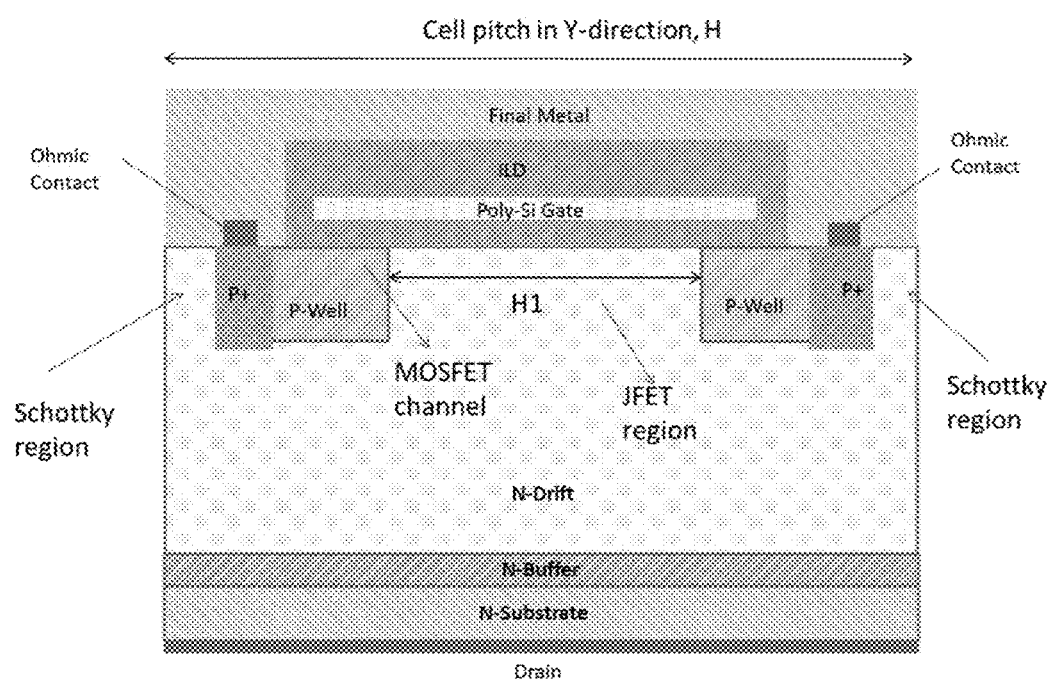

FIGS. 10A and 10B show diagrams of a single cell of a MOSFET with an integrated Schottky diode. Although a single cell is depicted in FIGS. 10A and 10B, a MOSFET layout can include a multitude of repeating cells shaped in this form. FIG. 10A is a schematic top-view layout of the cell design including the integrated Schottky diode. As depicted in FIG. 10A, the device includes two Schottky regions wherein the rectifying Schottky contact is formed between a metal layer and the drift-layer of the MOSFET. FIG. 10B is a schematic cross-sectional view of the MOSFET with integrated Schottky contact viewed through the cut line H-H' shown in FIG. 10A. As can be seen from FIG. 10B, the device includes two Schottky regions wherein a rectifying Schottky contact is formed between the final metal layer and the n-type drift region.

By removing overhead and having a small JFET width (e.g., <3 µm), the design described herein allows a small cell pitch and high channel density. According to some embodiments, the small JFET width is enabled by adding an implant in the JFET region that increases the JFET region doping. Adding an implant to the JFET region minimizes the impact of JFET resistance when the JFET width is minimized. Without the JFET implant, the JFET doping would be the same as the drift layer doping (e.g., $1\times10^{15}$ to $2\times10^{16}$ cm$^{-3}$). By using a JFET implant, the doping can be increased to a higher concentration than the drift layer. According to some embodiments, the JFET implant can have a doping concentration of $5\times10^{15}$ to $5\times10^{16}$ cm$^{-3}$.

The drift layer can have a doping concentration of $1\times10^{15}$ to $2\times10^{16}$ cm$^{-3}$. The well regions (e.g., P well) can have a doping concentration of $2\times10^{16}$ to $2\times10^{18}$ cm$^{-3}$. The source regions (e.g., N+ regions) and the heavily doped layer of semiconductor material of the first conductivity type can have a doping concentration of $1\times10^{19}$ to $1\times10^{20}$ cm$^{-3}$. The heavily doped regions of the second conductivity type (e.g., P+ regions) can have a doping concentration of $5\times10^{18}$ to $1\times10^{20}$ cm$^{-3}$. These doping concentration ranges are merely representative and are not intended to be limiting. Other doping concentrations can be used to provide a device having desired characteristics for a given end use application. The heavily doped regions of the second conductivity type can have a higher doping concentration than the first and second well regions. The source or N+ regions and the heavily doped layer of semiconductor material of the first conductivity type can have a higher doping concentration than the drift layer.

According to some embodiments, a vertical DMOSFET device is described wherein current flows in at least two different directions in the lateral or horizontal plane (e.g., the X and Y directions) between the channel of the device and the source contacts of the device. In a vertical DMOSFET device, the majority of the current flows initially vertically from the backside drain contact and through the drift region and into the JFET region. The current then changes direction to flow through the channel region in a lateral plane of the device. According to some embodiments, at least 50% of the total device current flows from the JFET region to the source silicide contacts in at least two different directions in the lateral plane of the device. According to some embodiments, the second direction forms an angle with the first direction of at least 50 degrees.

Figure 11:
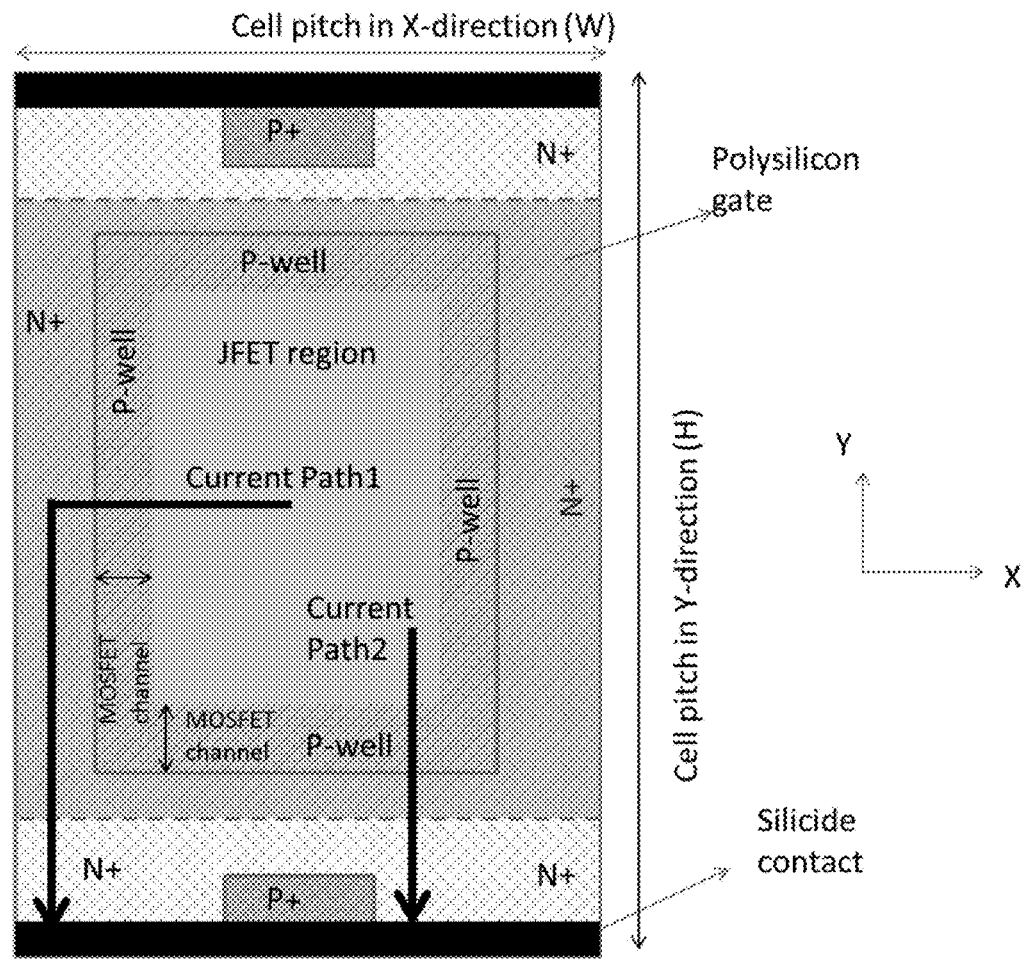
FIG. 11 is a schematic diagram showing two different current paths in the lateral plane of the device shown in FIG. 1A from the JFET region to the silicide contacts.

FIG. 11 is a schematic diagram showing current paths in a device as shown in FIG. 1A. Initially the current flows from the backside of the wafer vertically through the drift region into the JFET region (not shown). As shown in FIG. 11, the current flow can then take multiple paths from the JFET region to the silicide contacts. For example, the current can flow laterally through the channel to the source contacts in at least two different directions (i.e., a first direction and a second direction) before being collected at the source silicide contact as shown by "Current Path 1". The current in the device can also flow laterally through the channel without significantly changing direction prior to being collected at the source silicide contact as shown in "Current Path 2".

As shown in FIG. 11, some current in the device may flow from the channel to the source silicide contact without substantially changing direction (e.g., "Current Path 2"). However, according to this aspect of the invention, at least 50% of the total current in the device flows in first and second directions in a lateral plane of the device from the JFET region to the source contacts wherein the second direction forms an angle of at least 50 degrees with respect to the first direction.

Figure 12A:
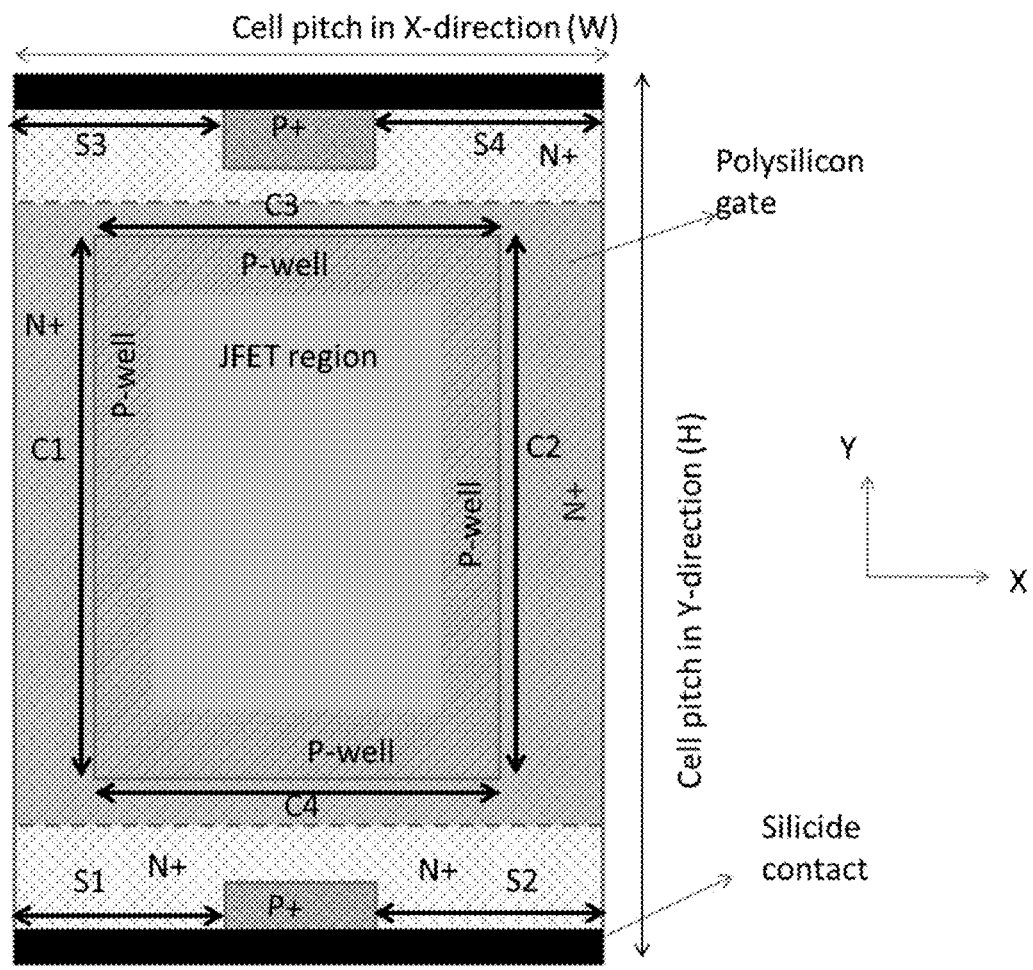
FIG. 12A is a schematic showing the width of the silicide contact and the channel width for a device as shown in FIG. 1A which has active channels in both the X and Y directions.
Figure 12B:
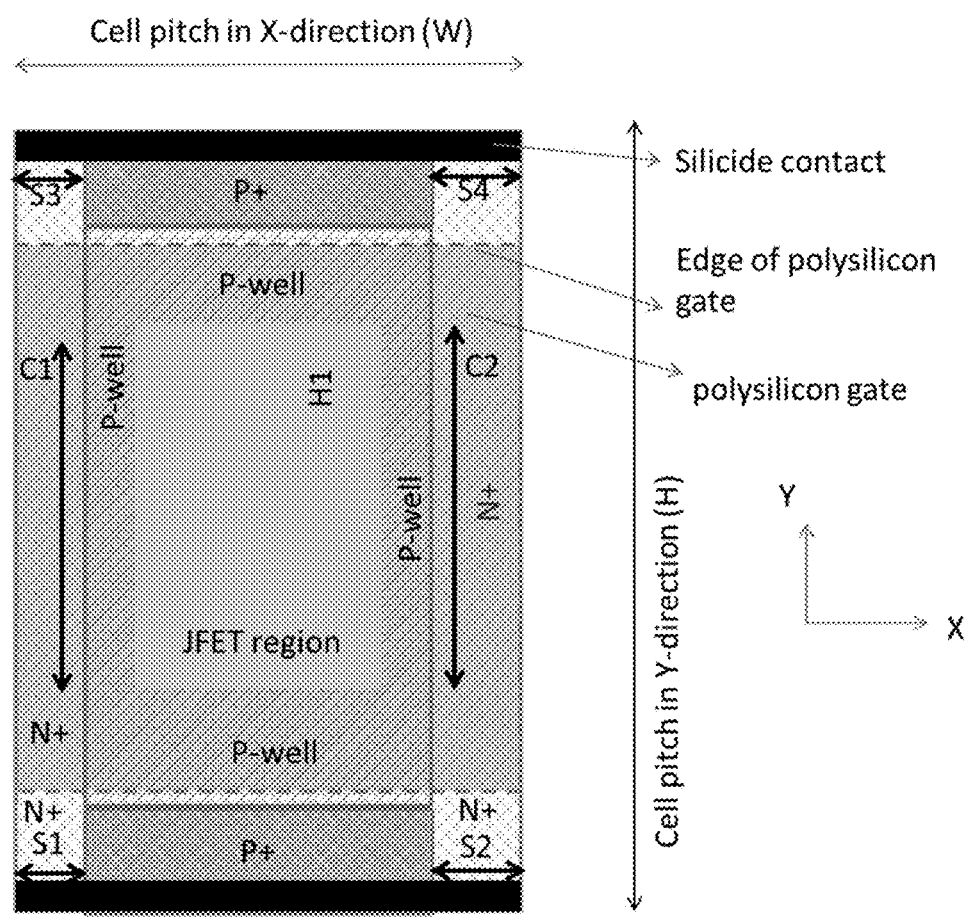
FIG. 12B is a schematic showing the width of the silicide contact and the channel width for a device as shown in FIG. 10A which has active channels only in the Y-direction.

According to some embodiments, a vertical DMOSFET device is described wherein the width of the silicide contact to the n-type regions is relatively small with respect to the channel width. According to some embodiments, the width of the contact to the N+ doped region is less than 50% of the width of the channel. FIG. 12A shows the width of the silicide contact for a device as shown in FIG. 1A which has active channels in both the X and Y directions. In this embodiment, the channel width is the total width of the channel in both the X and Y directions (i.e., C1+C2+C3+C4). For the device of FIG. 12A, the silicide contact width to the source is the total width of the contact region that contacts the n-plus regions of the device (i.e., S1+S2+S3+S4). FIG. 12B is a schematic diagram showing the channel width for a device as depicted in FIG. 10A which has active channel only in the Y-direction. As shown in FIG. 12B, the channel width includes only the sum of the channel widths in the y-direction (i.e., C1+C2), since there is no active channel in the x-direction. As with the device of FIG. 12A, the silicide contact width to the source for the device of FIG. 12B is the total width of the contact region that contacts the n-plus regions of the device (i.e., S1+S2+S3+S4).

According to some embodiments, a vertical DMOSFET device is described wherein current is not collected by the source contact in the immediate vicinity of the majority of the channel. Rather, the current flows a substantial length (e.g., >2 μm or >a minimum feature size of the device) in an N+ doped region adjacent the channel before reaching the source contact. As used herein, the minimum feature size of a device is the minimum line width or line to line separation of the device.

According to some embodiments, a vertical DMOSFET device is provided having a breakdown voltage >600V, a minimum feature size >0.3 μm and a cell pitch <6 μm. According to some embodiments, a vertical DMOSFET device is provided having a breakdown voltage >600V, a minimum feature size >0.3 μm and having a channel density >350 mm/mm$^2$.

Figure 13A:
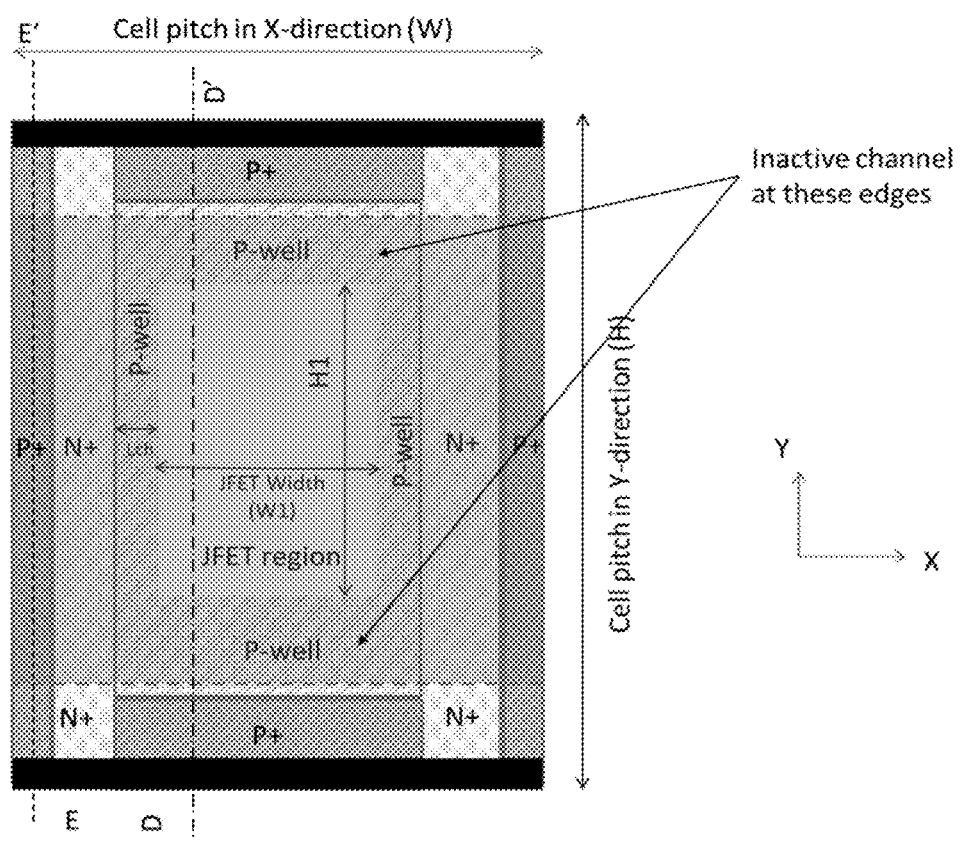
FIG. 13A is a layout view of a unit cell of a MOSFET device according to a further embodiment wherein the poly-Si gate does not overlap the N+ regions in the y-direction forming a unit cell having inactive channel along these two edges.
Figure 13B:
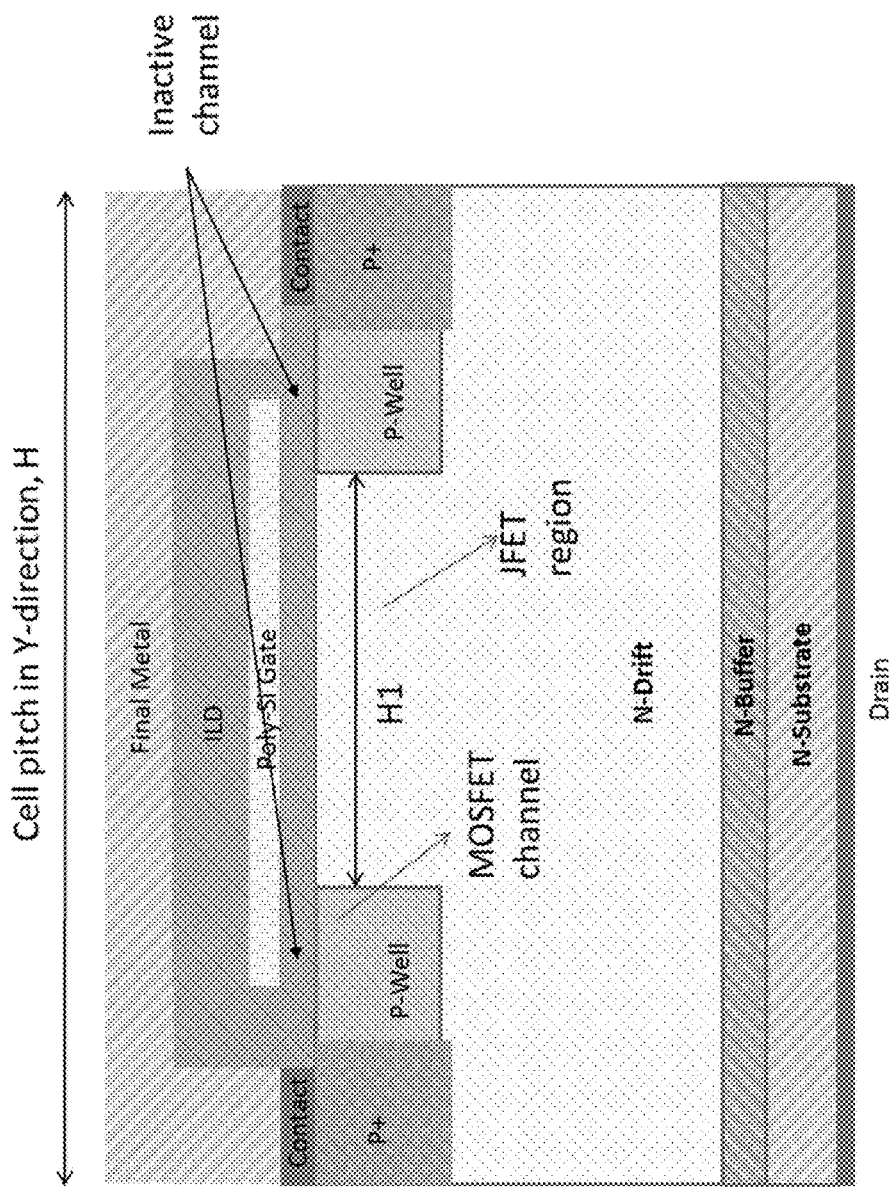
FIG. 13B is a cross-section of the unit cell of FIG. 13A along the cutline D-D'.

According to some embodiments, a vertical DMOSFET device is provided comprising a unit cell having inactive channels on the end regions of the unit cell. On the two inactive end regions of the unit cell, the edge of the polysilicon gate does not overlap the N+ regions. A device according to this embodiment is depicted in FIG. 13A. As shown in FIG. 13A, the device includes a polysilicon gate which extends in both the x and y directions. The edges of the polysilicon gate in the y direction, however, do not extend over the N+ regions. This can be seen in FIG. 13B which is a cross-section of the device depicted in FIG. 13A through the cutline D-D'. As can be seen in FIG. 13B, there is no overlap of polysilicon gate and the n+ region along the cutline D-D'. While not wishing to be bound by theory, it is believed that the channel regions without overlap between the polysilicon gate and the n+ regions do not conduct electron current.

By making end regions of the device inactive and, depending upon the MOSFET channel mobility in different crystal planes, the cell pitch may be reduced in this direction and thus the on-resistance of the device may be reduced.

Figure 14A:
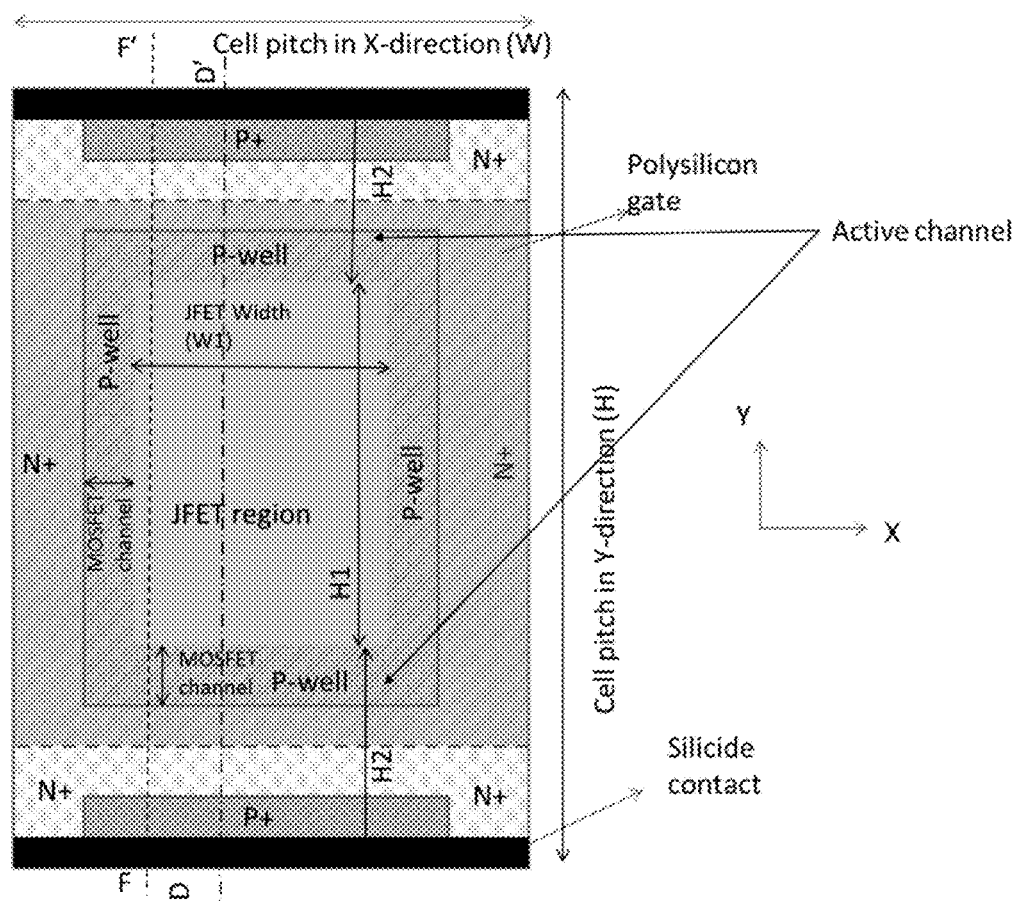
FIG. 14A is a layout view of a unit cell of a MOSFET device according to a further embodiment wherein the poly-Si gate overlaps the N+ regions in the y-direction forming a unit cell having active channel along these two edges.
Figure 14B:
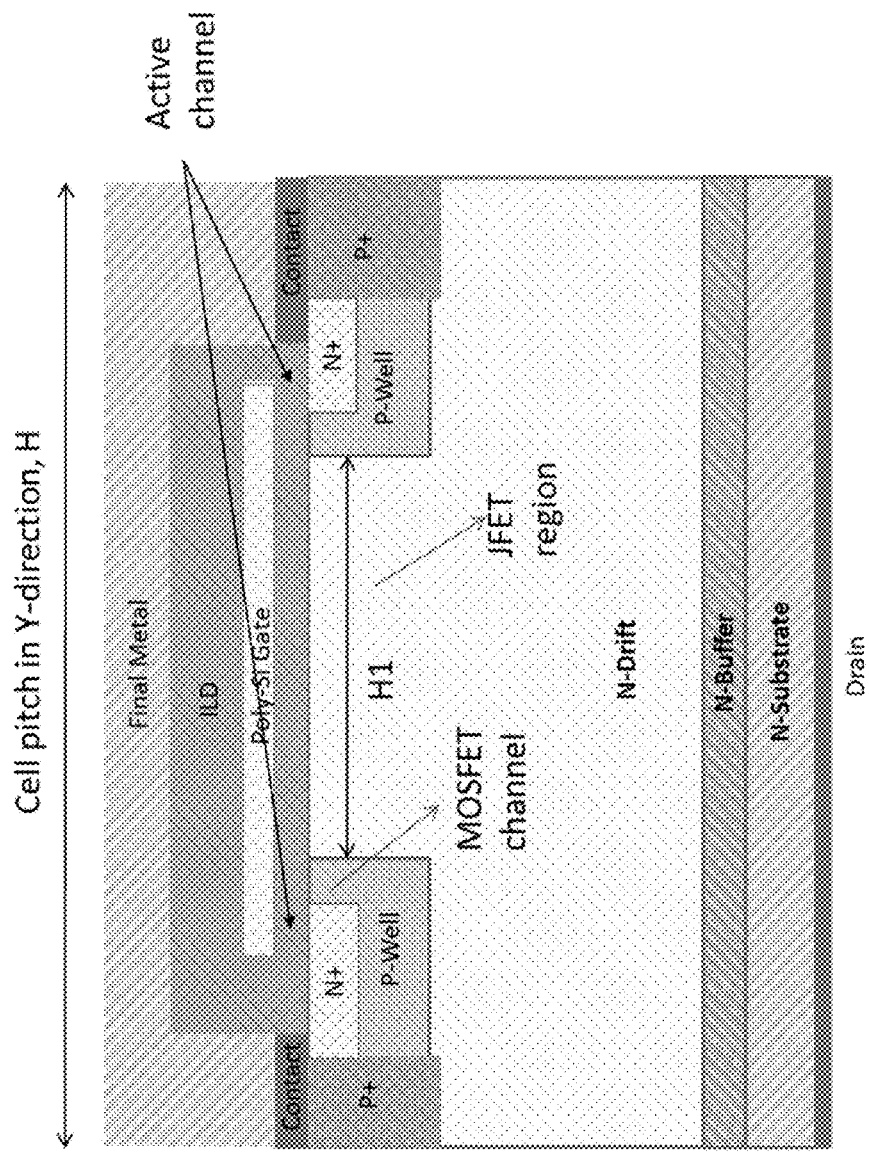
FIG. 14B is a cross-section of the unit cell of FIG. 14A along the cutline D-D'.

According to some embodiments, a vertical DMOSFET device is provided comprising a unit cell having active channels on the end regions of the unit cell. According to this embodiment, on the two active end regions of the unit cell the edge of the polysilicon gate overlaps the N+ regions. A device having active channels on the end regions of the unit cell is depicted in FIG. 14A. As shown in FIG. 14A, the device includes a polysilicon gate which extends in both the x and y directions. The edges of the polysilicon gate in the y direction extend over the N+ regions. This can be seen in FIG. 14B which is a cross-section of the device depicted in FIG. 14A through the cutline D-D'. As can be seen in FIG. 14B, there is an overlap of polysilicon gate and the n+ region along the cutline D-D' forming an active channel along these edges. While not wishing to be bound by theory, it is believed that the channel regions with overlap between the polysilicon gate and the n+ regions conduct electron current.

By making the end regions of the unit cell active, a device having an increased channel periphery is provided. Depending upon the channel mobility in the different crystal orientations, use of this cell structure may result in a device having reduced on-resistance.

The ability of the MOSFET to withstand fast voltage transients on the drain voltage is controlled by the output capacitance and resistance in series with the output capacitance. If the maximum drain voltage transient (dV/dt) is exceeded, the parasitic bipolar transistor can turn on and the device will be destroyed. The series resistance is dominated by the distributed p-well resistance. To reduce this p-well resistance in the device embodiments described here, an additional p+ region can be provided underneath the n-plus regions formed in the y-direction.

Figure 15A:
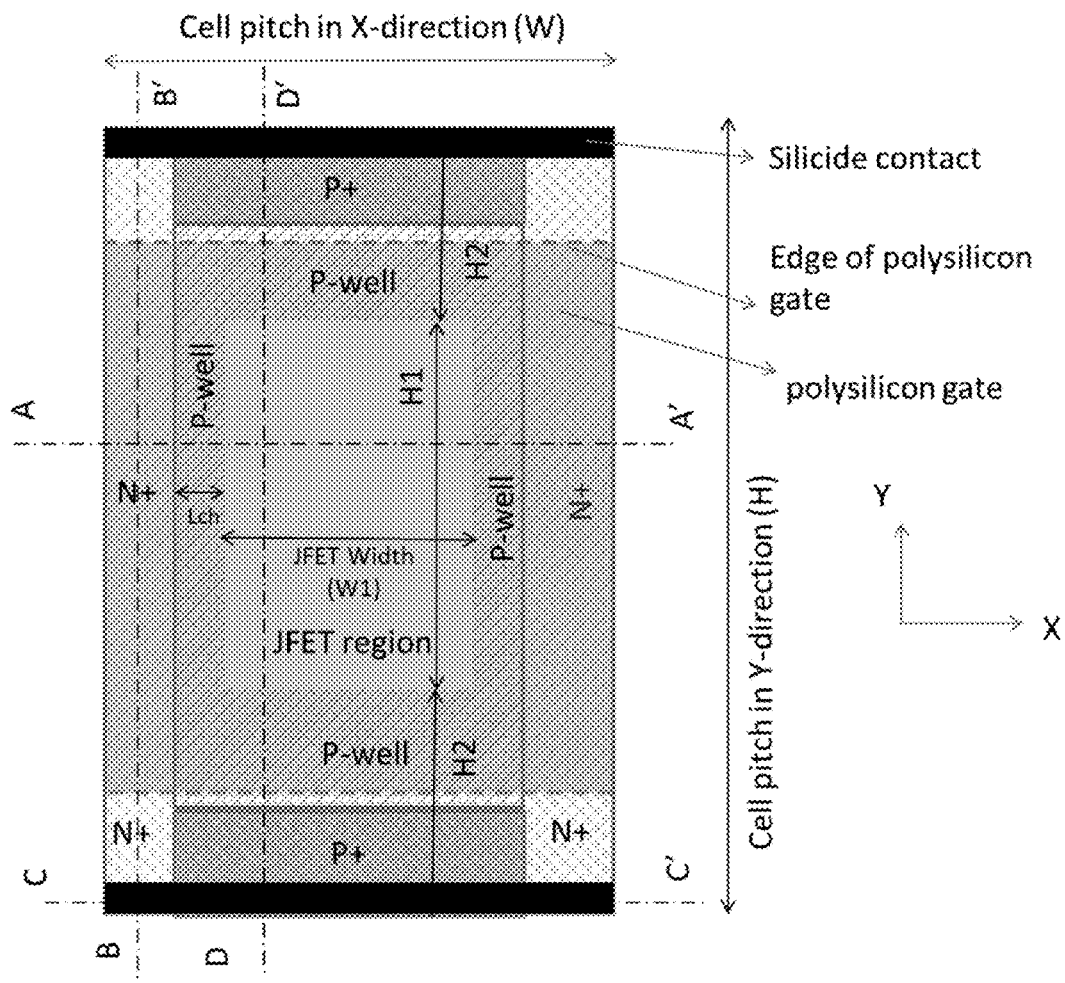
FIG. 15A is a layout view of a unit cell of a MOSFET device according to a further embodiment wherein the P+ regions are under the N+ regions.
Figure 15B:
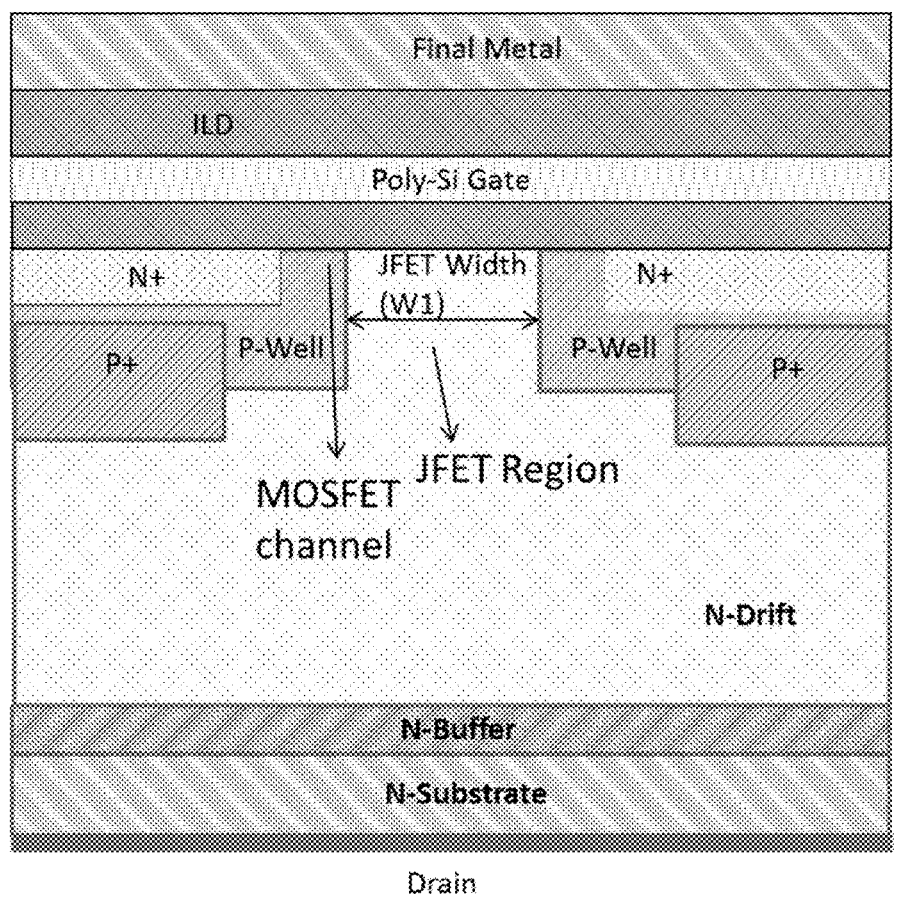
FIG. 15B is a cross-section of the unit cell of FIG. 15A along the cutline A-A'.

A device having a p+ region beneath the n+ region is shown in FIGS. 15A and 15B. FIG. 15A is a layout view of a unit cell of a MOSFET device according to a further embodiment wherein the P+ regions are under the N+ regions. FIG. 15B is a cross-section of the unit cell of FIG. 15A along the cutline A-A'. As shown in FIG. 15B, the p+ region is a buried region positioned below the n+ regions. This p+ region reduces the resistance along the p-well region and also reduces the resistance to the p+ contact regions. By including this p+ region, the resistance in series with the output capacitance can be reduced, thereby increasing the maximum drain voltage that the device can withstand without turning on the parasitic bipolar transistor.

Figure 16A:
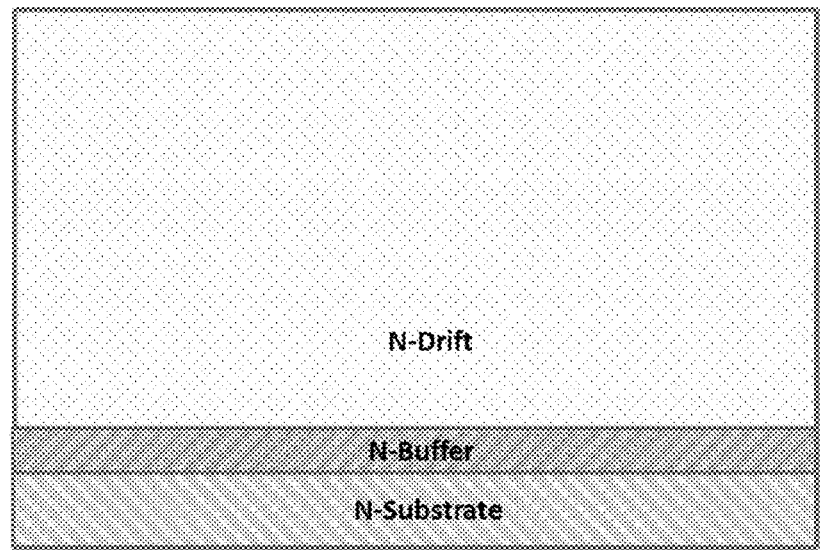
FIGS. 16A-16C are schematics illustrating a method of making a MOSFET device according to FIGS. 15A and 15B having P+ regions under the N+ regions.
Figure 16B:
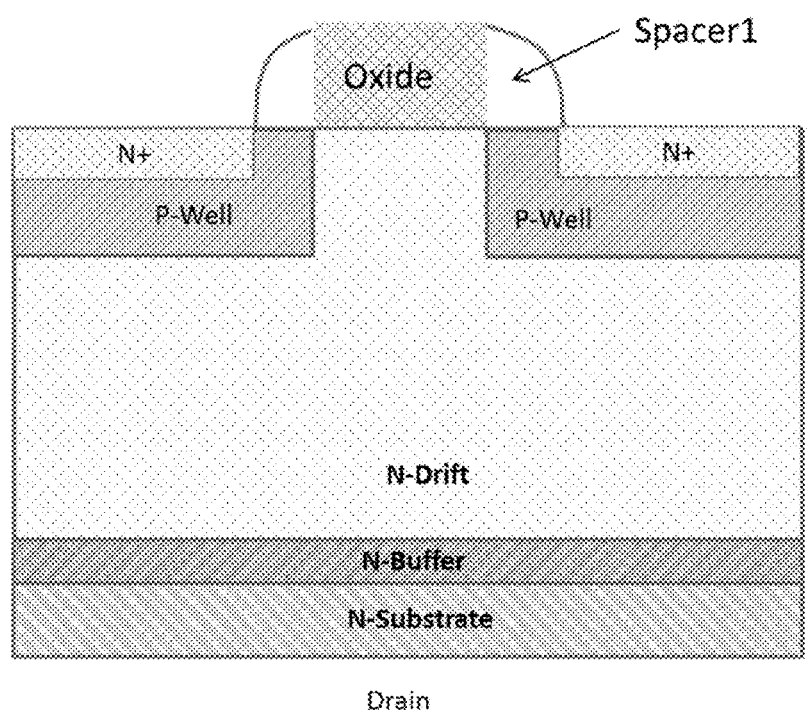
Figure 16C:
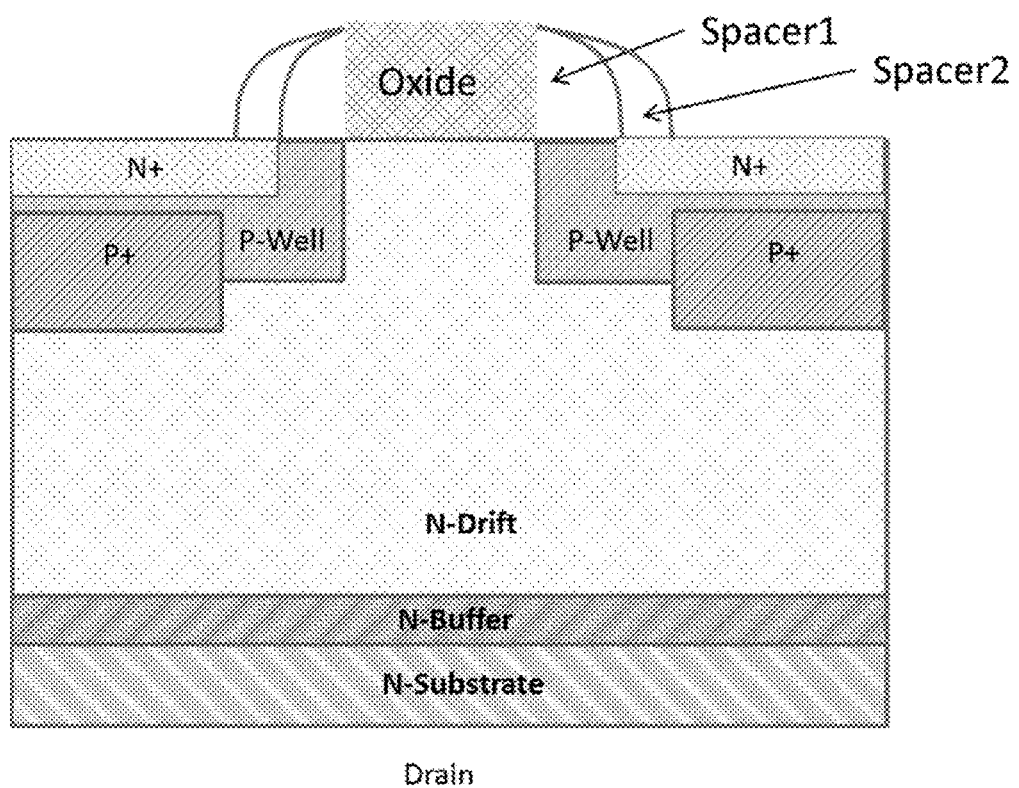

FIGS. 16A-16C are schematics illustrating a method of making a MOSFET device according to FIGS. 15A and 15B having P+ regions under the N+ regions. According to the method depicted in FIGS. 16A-16C, first and second spacers are used to form the n+ and buried p+ regions, respectively.

FIG. 16A is a cross section of the starting epilayer stack along the cutline A-A' of FIG. 15A. As shown in FIG. 16A, the starting epilayer stack includes an n-type drift layer (n-drift) on an n-type buffer layer (n-buffer) on an n-type substrate (n-substrate). An oxide layer is deposited, etched and implanted to form the p-well region. The oxide remaining after implantation to form the p-well region ("oxide") is left on the wafer and a first spacer oxide layer is deposited and blanket etched to form a first spacer adjacent the oxide. The n+ region is then implanted. The resulting structure has a cross-section along the cutline A-A' of FIG. 15A as shown in FIG. 16B. Next, the oxide and first spacer is left on the wafer and a second spacer oxide layer is deposited and blanket etched to form a second spacer adjacent the first spacer. Then, the p+ buried regions are implanted beneath the n+ regions adjacent the second spacer. The resulting structure has a cross-section along the cutline A-A' of FIG. 15A as shown in FIG. 16C.

During the process depicted in FIGS. 16A-16C, additional masking and etching steps may be performed to open or block additional regions for implantation of the n+ and p+ implants. After formation of the structure depicted in FIG. 16C, the rest of the structure can be completed to form a MOSFET, including forming the gate oxide, gate electrode, Ohmic contacts, interlayer dielectric and final metal and passivation layers.

Figure 17:
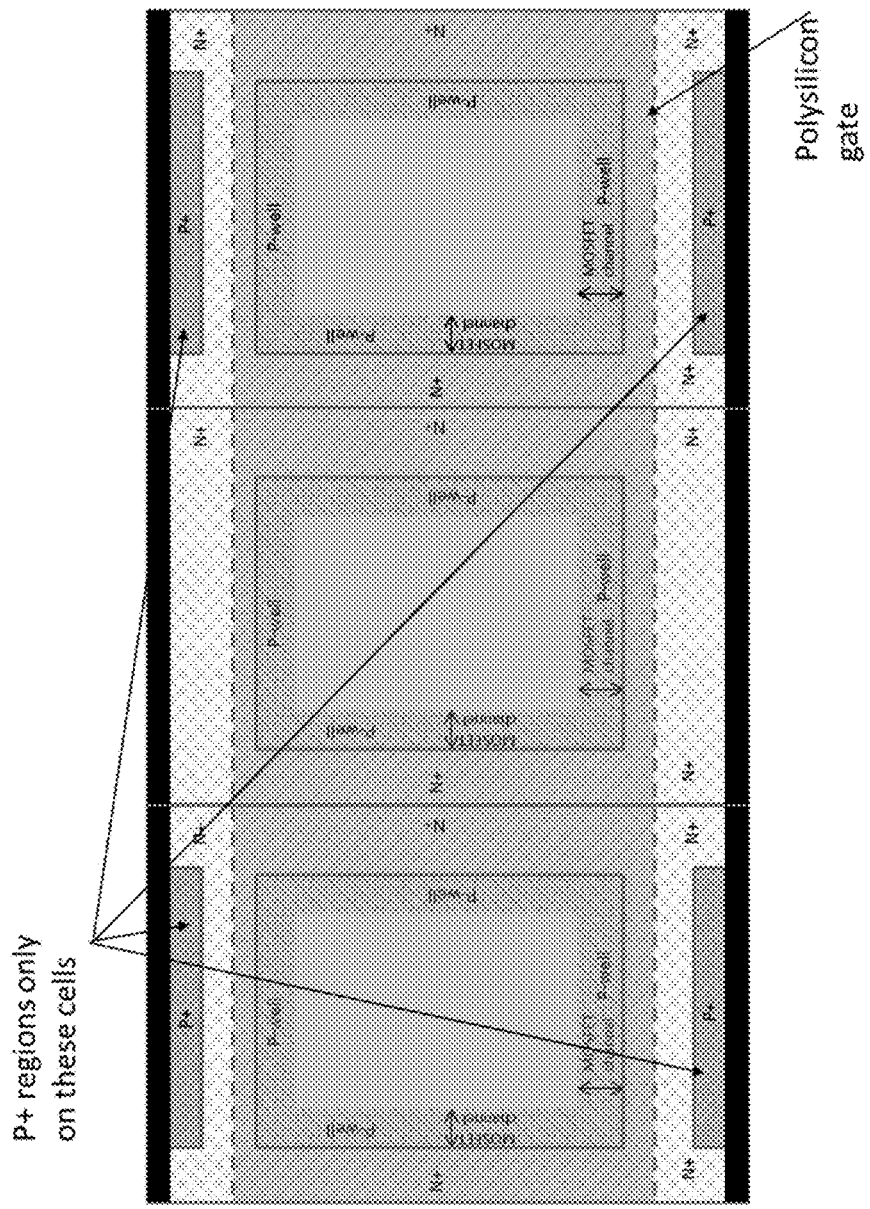
FIG. 17 is a layout view of a MOSFET device according to a further embodiment comprising a plurality of unit cells wherein P+ regions are only provided in some of the unit cells.

According to some embodiments, a vertical DMOSFET device is provided having a plurality of unit cells wherein p+ regions are only provided in some of the unit cells. A device having a plurality of unit cells wherein p+ regions are only provided in some of the unit cells is shown in FIG. 17.

By providing the p+ regions only in some of the unit cells, a MOSFET having an increased amount of n+ contact regions can be provided. The device may have a reduced overall n+ source resistance and source contact resistance. According to some embodiments, the frequency and size of the p+ regions can be selected to minimize the overall n+ source resistance and source contact resistance.

Figure 18A:
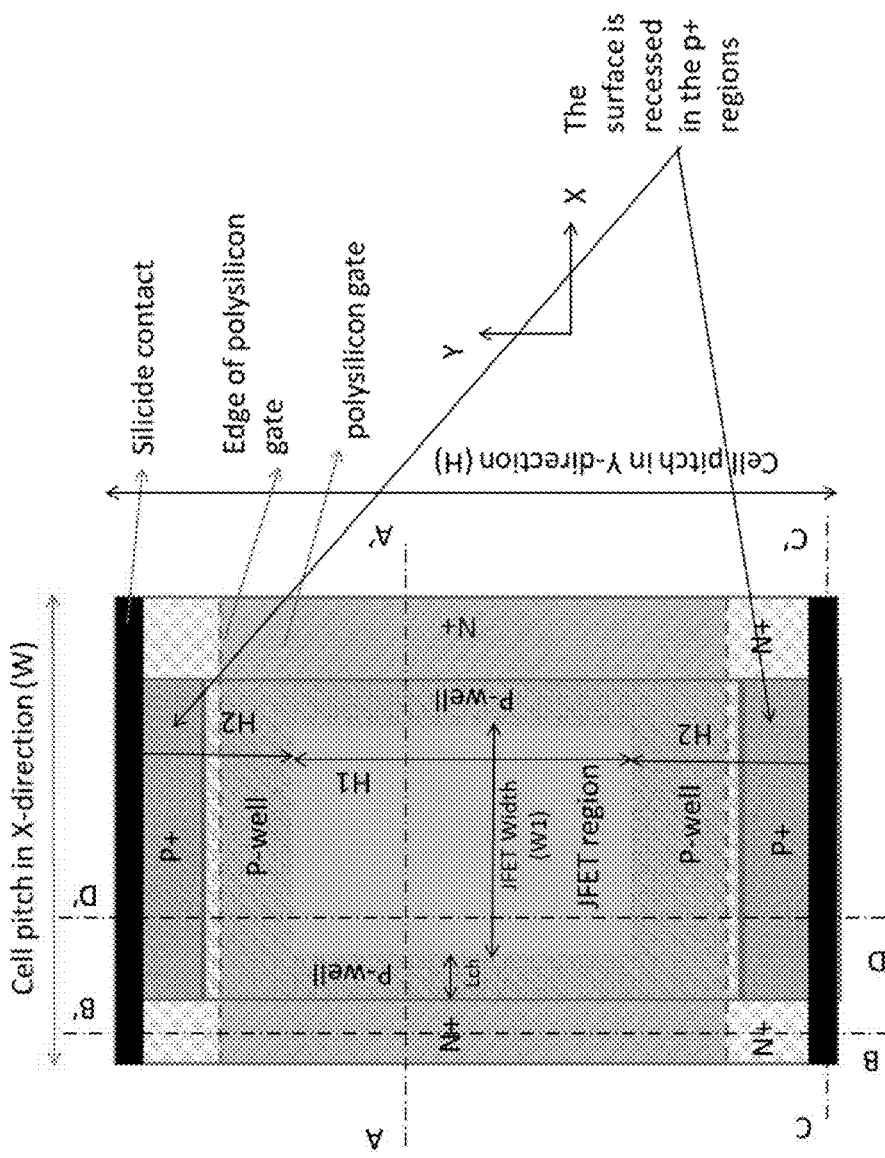
FIG. 18A is a layout view of a unit cell of a MOSFET device according to a further embodiment wherein the P+ regions are recessed such that the upper surface of the P+ regions is below the upper surface of the N+ and/or P-well regions.
Figure 18B:
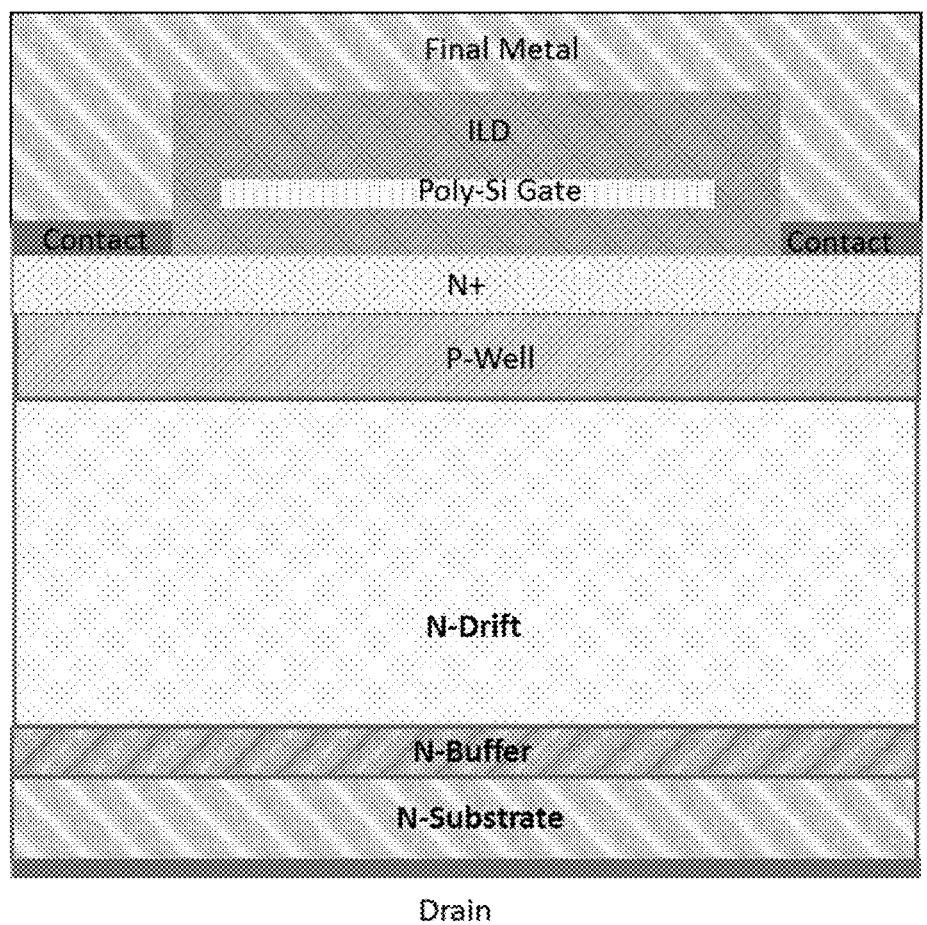
FIG. 18B is a cross-section of the unit cell of FIG. 18A along the cutline B-B'.
Figure 18C:
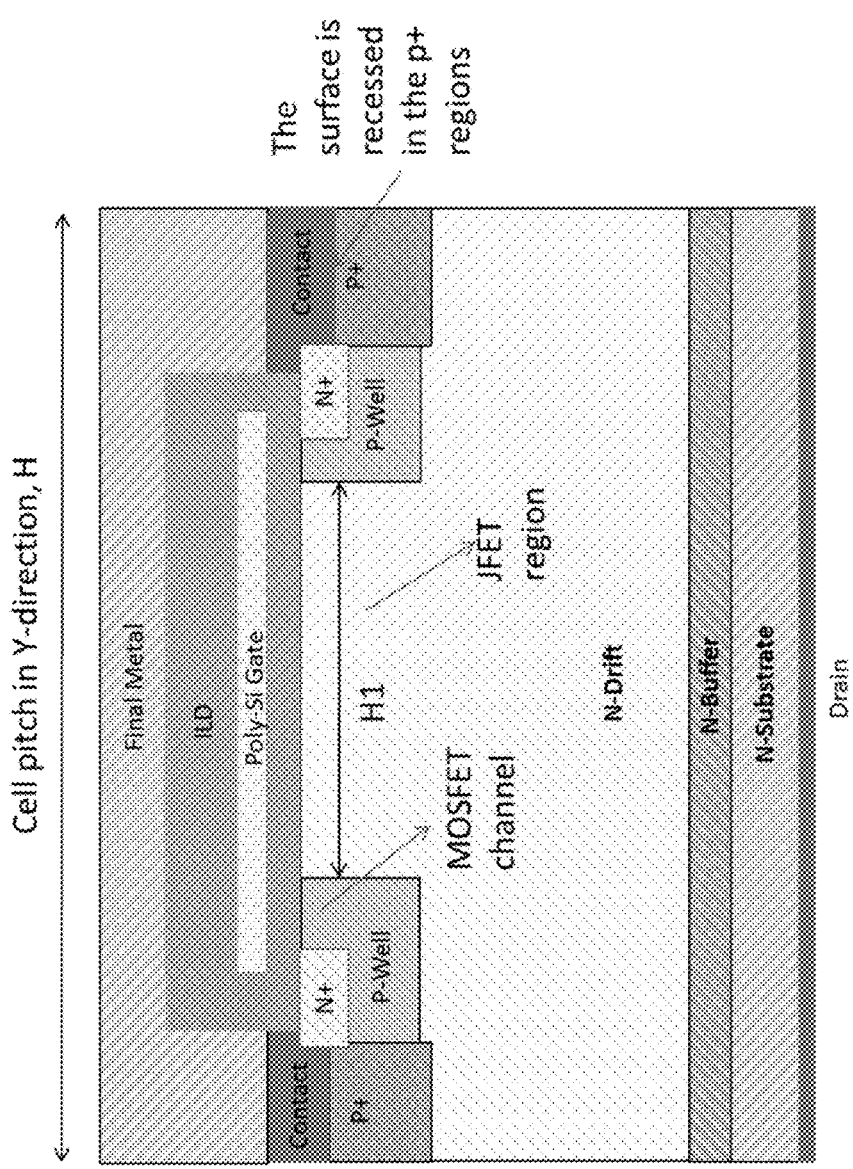
FIG. 18C is a cross-section of the unit cell of FIG. 18A along the cutline D-D'.

According to some embodiments, a vertical DMOSFET device is provided having a recess in the regions of the P+ contacts. A device having a recess in the regions of the P+ contacts is shown in FIGS. 18A-18C. FIG. 18A is a layout view of a unit cell of a MOSFET device wherein the P+ regions are recessed such that the upper surface of the P+ regions is below the upper surface of the N+ and/or P-well regions. FIG. 18B is a cross-section of the unit cell of FIG. 18A along the cutline B-B'. FIG. 18C is a cross-section of the unit cell of FIG. 18A along the cutline D-D'.

As shown in FIG. 18C, the semiconductor surface is recessed in the P+ regions. In particular, the upper surface of the P+ regions is at a level below the upper surface of the P-well and/or N+ regions. Upper surface of a region as used herein refers to the surface of a region opposite the substrate layer. This recess in the P+ regions is covered by the Ohmic contact. As shown in FIG. 18C, the ohmic contact may also overlap the adjacent n+ region.

By using a recess, the p+ contact region width can be reduced, thereby allowing for reductions in the cell pitch. By reducing the p+ contact width and reducing the cell pitch, the channel density per unit of surface area can be increased thereby reducing the overall device on-resistance.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A semiconductor device comprising at least one semiconductor cell, wherein the semiconductor cell comprises:
   a semiconductor substrate layer of a first conductivity type;
   optionally, a buffer layer of a semiconductor material of the first conductivity type on the substrate layer;
   a drift layer of a semiconductor material of the first conductivity type on the buffer layer or on the substrate;
   a first well region of a semiconductor material of a second conductivity type different than the first conductivity type extending in a Y direction in the drift layer and having first and second ends;
   a second well region of a semiconductor material of the second conductivity type extending in the Y direction in the drift layer and having first and second ends, wherein the second well region is spaced from the first well region in an X direction perpendicular to the Y direction and wherein the first ends of each of the first and second well regions are connected together in the X direction by a third well region of semiconductor material of the second conductivity type and the second ends of each of the first and second well regions are connected together in the X direction by a fourth well region of semiconductor material of the second conductivity type to form a ring circumscribing a JFET region in the drift layer;
   a first source region of a semiconductor material of the first conductivity type extending in the Y direction in the first well region, wherein the first source region has a depth less than the depth of the first well region such that there is an underlying portion of the first well region beneath the first source region and wherein the first source region is spaced from the JFET region such that a portion of the first well region remains between the JFET region and the first source region;
   a second source region of a semiconductor material of the first conductivity type extending in the Y direction in the second well region, wherein the second source region has a depth less than the depth of the second well region such that there is an underlying portion of the second well region beneath the second source region and wherein the second source region is spaced from the JFET region such that a portion of the second well region remains between the JFET region and the second source region;

wherein the first and second source regions have first and second ends which extend beyond the JFET region in the Y direction;

a first heavily doped region of the second conductivity type extending in the X direction between the first ends of the first and second source regions and contacting the first and second well regions;

a second heavily doped region of the second conductivity type extending in the X direction between the second ends of the first and second source regions and spaced from the first heavily doped region in the Y direction and contacting the first and second well regions;

a third source region of a semiconductor material of the first conductivity type extending in the X direction in the third well region adjacent the first heavily doped region, wherein the third source region is spaced from the JFET region such that a portion of the third well region remains between the JFET region and the third source region;

a fourth source region of a semiconductor material of the first conductivity type extending in the X direction in the fourth well region adjacent the second heavily doped region, wherein the fourth source region is spaced from the JFET region such that a portion of the fourth well region remains between the JFET region and the fourth source region;

a first source ohmic contact extending in the X direction and directly contacting the first heavily doped region and the first and second source regions adjacent thereto;

a second source ohmic contact extending in the X direction and directly contacting the second heavily doped region and the first and second source regions adjacent thereto, wherein the second source ohmic contact is spaced from the first source ohmic contact in the Y direction;

a gate dielectric layer on the drift layer and in contact with the first source region and the second source region between the first and second source ohmic contacts;

a gate electrode on the first gate dielectric layer, wherein the gate electrode is spaced from the first and second source ohmic contacts in the Y direction;

an interlayer dielectric on the gate electrode and on a peripheral portion of the first gate dielectric layer not covered by the gate electrode; and a source metal region in contact with the first and second source ohmic contacts;

wherein the gate electrode extends over the first and second source regions in the X direction to form active channels along the edges of the gate electrode extending in the Y direction; and wherein the gate electrode extends over the third and fourth source regions in the Y direction to form active channels along the edges of the gate electrode extending in the X direction.

2. The semiconductor device of claim 1, wherein the gate dielectric and the gate electrode extends at least to an outer edge of the first and second source regions in the X direction.

3. The semiconductor device of claim 1, wherein the semiconductor cell has a width in the X direction of 2 to 10 μm or a length in the Y direction of 2 to 30 μm.

4. The semiconductor device of claim 1, wherein the JFET region has a width of 1 to 6 μm in the X direction or a length of 2 to 30 μm in the Y direction.

5. The semiconductor device of claim 1, wherein:
the JFET region, the outer perimeter of the ring circumscribing the JFET region and the semiconductor cell are rectangular in shape;
the semiconductor cell is rectangular in shape and the outer perimeter of the ring circumscribing the JFET region is curved; or
the semiconductor cell is rectangular in shape and the outer perimeter of the ring circumscribing the JFET region and JFET region are hexagonal in shape.

6. The semiconductor device of claim 1, wherein the first conductivity type is N-type and wherein the second conductivity type is P-type.

7. The semiconductor device of claim 1, wherein the device comprises a plurality of the semiconductor cells.

8. The semiconductor device of claim 1, wherein the device is a SiC semiconductor device.

9. The semiconductor device of claim 3, wherein the semiconductor cell has a width in the X direction of 2 to 10 μm and a length in the Y direction of 2 to 30 μm.

10. The semiconductor device of claim 4, wherein the JFET region has a width of 1 to 6 μm in the X direction and a length of 2 to 30 μm in the Y direction.

11. The semiconductor device of claim 5, wherein:
the JFET region, the outer perimeter of the ring circumscribing the JFET region and the semiconductor cell are rectangular in shape.

12. The semiconductor device of claim 5, wherein:
the semiconductor cell is rectangular in shape and the outer perimeter of the ring circumscribing the JFET region is curved.

13. The semiconductor device of claim 5, wherein:
the semiconductor cell is rectangular in shape and the outer perimeter of the ring circumscribing the JFET region and JFET region are hexagonal in shape.

* * * * *